United States Patent
Tsunoda

(10) Patent No.: US 9,680,483 B2
(45) Date of Patent: Jun. 13, 2017

(54) CURRENT MIRROR CIRCUIT AND CHARGE PUMP CIRCUIT

(71) Applicant: FUJITSU LIMITED, Kawasaki-shi, Kanagawa (JP)

(72) Inventor: Yukito Tsunoda, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 170 days.

(21) Appl. No.: 14/573,855

(22) Filed: Dec. 17, 2014

(65) Prior Publication Data

US 2015/0207513 A1  Jul. 23, 2015

(30) Foreign Application Priority Data

Jan. 21, 2014 (JP) ................ 2014-008611

(51) Int. Cl.
*G05F 3/26* (2006.01)
*H03L 7/089* (2006.01)
(Continued)

(52) U.S. Cl.
CPC .......... *H03L 7/0895* (2013.01); *G05F 3/26* (2013.01); *G05F 3/262* (2013.01); *H03K 5/2481* (2013.01); *H02M 3/07* (2013.01)

(58) Field of Classification Search
CPC ......... H03L 7/0895; G05F 3/262; G05F 3/26; G05F 3/265; G05F 3/267; H03K 5/2481; H02M 3/07
See application file for complete search history.

(56) References Cited

U.S. PATENT DOCUMENTS 5,666,046 A * 9/1997 Mietus .......... G05F 3/267
                                              323/313
5,694,033 A * 12/1997 Wei ............. G05F 3/262
                                              323/315
(Continued)

FOREIGN PATENT DOCUMENTS

JP          6-61859       3/1994
JP       2000-114891      4/2000

OTHER PUBLICATIONS

Li et al., "A Fully On-Chip 10Gb/s CDR in a Standard 0.18 µm CMOS Technology", IEEE Radio Frequency Integrated Circuits Symposium, 2007, pp. 237-240.
(Continued)

*Primary Examiner* — Jung Kim
(74) *Attorney, Agent, or Firm* — Staas & Halsey LLP

(57) ABSTRACT

A current mirror circuit includes: a reference current circuit including a reference transistor and a constant current source coupled between a high potential source and a low potential source; a first proportional current circuit, including a first transistor that forms a first current mirror circuit with the reference transistor, to generate a first current having a first ratio to a reference current of the reference current circuit; a second proportional current circuit, including a second transistor that forms a second current mirror circuit with the reference transistor, to generate a second current having a second ratio to the reference current; a comparison circuit to output a difference between a drain voltage of the first transistor and a drain voltage of the second transistor; and a current adjustment transistor coupled to a drain of the second transistor and including a gate to which an output of the comparison circuit is applied.

7 Claims, 22 Drawing Sheets

(51) Int. Cl.
*H03K 5/24* (2006.01)
*H02M 3/07* (2006.01)

(56) References Cited

U.S. PATENT DOCUMENTS

| | | | | |
|---|---|---|---|---|
| 6,181,195 B1* | 1/2001 | McIntyre | ................ | G05F 3/262 |
| | | | | 323/316 |
| 2002/0135424 A1* | 9/2002 | Oikawa | ................... | H03M 1/50 |
| | | | | 330/288 |
| 2010/0156379 A1* | 6/2010 | Marino | ............ | G01R 19/16552 |
| | | | | 323/293 |

OTHER PUBLICATIONS

Greshishchev et al., "SiGe Clock and Data Recovery IC with Linear-Type PLL for 10-Gb/s SONET Application", IEEE Journal of Solid-State Circuits, vol. 35, No. 9, Sep. 2000, pp. 1353-1359.

* cited by examiner

CURRENT MIRROR CIRCUIT AND CHARGE PUMP CIRCUIT

CROSS-REFERENCE TO RELATED APPLICATION

This application is based upon and claims the benefit of priority from the prior Japanese Patent Application No. 2014-008611 filed on Jan. 21, 2014, the entire contents of which are incorporated herein by reference.

FIELD

The embodiments discussed herein are related to a current mirror circuit and a charge pump circuit.

BACKGROUND

A phase-locked loop (PLL) circuit includes a charge pump that performs a charge and discharge operations for a loop filter in accordance with phase difference information. A charge pump circuit that is used for a voltage controlled oscillator (VCO) in order to increase a range of control voltage of the VCO of the PLL circuit includes a current mirror configuration by which charge current and discharge current become equal.

Related arts has been discussed in Japanese Laid-open Patent Publication No. 6-61859, Japanese Laid-open Patent Publication No. 2000-114891, a paper entitled "A Fully On-Chip 10 Gb/s CDR in a Standard 0.18 um CMOS Technology" Jinghua Li, et al., IEEE Radio Frequency Integrated Circuits Symposium, 2007 No. 9, P. 237-240, or a paper entitled "SiGe Clock and Data Recovery IC with Linear-Type PLL for 10-Gb/s SONET Application" Yuriy M. Gireshishchev, J. Solid State Circuits Vol. 35, No. 9, P. 1353.

SUMMARY

According to an aspect of the embodiments, a current mirror circuit includes: a reference current circuit including a reference transistor and a constant current source that are coupled in series between a high potential source and a low potential source; a first proportional current circuit, including a first transistor that is coupled to one of the high potential source and the low potential source so as to form a first current mirror circuit with the reference transistor, configured to generate a first current having a first ratio to a reference current of the reference current circuit; a second proportional current circuit, including a second transistor that is coupled to one of the high potential source and the low potential source so as to form a second current mirror circuit with the reference transistor, configured to generate a second current having a second ratio to the reference current; a comparison circuit configured to output a difference between a drain voltage of the first transistor and a drain voltage of the second transistor; and a current adjustment transistor coupled to a drain of the second transistor and including a gate to which an output of the comparison circuit is applied.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
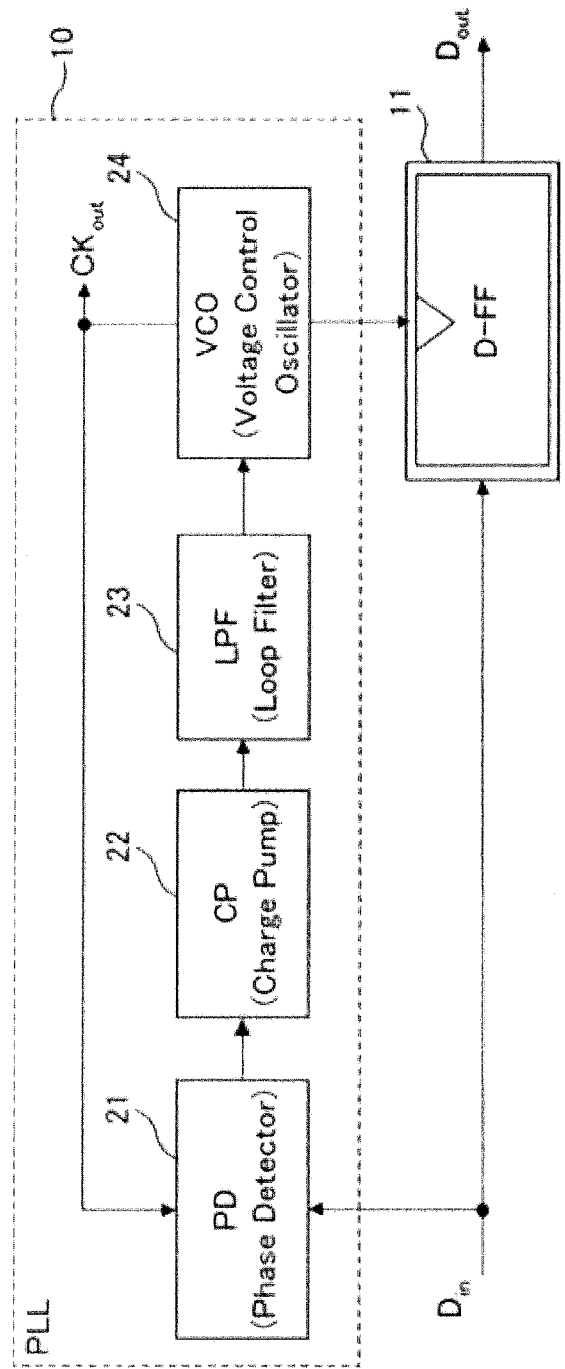
FIG. 1A illustrates an example of a reception circuit.

For a current mirror circuit, an n-type FET may be used, and a bipolar transistor may be used. The current mirror circuit is a circuit element that is widely used for various circuits in addition to a charge pump circuit. For example, in the current mirror circuit, when the same gate-source voltage is applied to FET transistors having a certain size ratio, currents having the same current ratio as the size ratio flow in the FET transistors, so that a current having a certain ratio to a current that flows through a reference current circuit is generated. The charge pump circuit includes the reference current circuit, and a first and second proportional current circuits to which current mirror circuits that respectively include transistors having opposite polarities are added. The ratio of current that flows the transistors having opposite polarities is equal in the first and second proportional current circuits.

In the current mirror circuit, it is assumed that an ideal transistor is used in which the current that flows through the transistor is not affected by the drain-source voltage, but the drain current may depend on the drain-source voltage. Therefore, due to a potential difference between two output terminals, a difference may occurs between two output currents, which is called a channel length modulation effect of a transistor.

In the charge pump circuit that includes the current mirror circuit, in accordance with the fluctuation of the voltage of the output terminal, for example, the control voltage of the VCO, a difference may occur between the charge current and the discharge current. In the PLL circuit, a control characteristic of the PLL circuit depends on charge current that is output from the charge pump. In the PLL circuit, the charge current and the discharge current may be substantially the same. When there is a difference between the charge current and the discharge current, stability of loop lock of the PLL circuit is reduced, so that the phase may not be locked.

For example, when an operation range of the VCO control voltage is limited, the stability of loop lock of the PLL circuit may be achieved. Due to the limit of the operation range of the VCO, a sync frequency range is reduced. To compensate this reduction, the gain of the VCO needs to be increase, but phase noise of the VCO may be increased.

For example, in the current mirror circuit having a cascode structure and the charge pump circuit, the operation range of voltage of the output terminal is limited, so that the sync frequency range is reduced. To compensate this reduction, the gain of the VCO needs to be increase, but the phase noise of the VCO may be increased.

When a difference occurs between the charge current and the discharge current, the PLL characteristic may be deteriorated, but the impact may be small when the charge current and the discharge current are changed in the same direction by substantially the same amount. Therefore, in the charge pump that is used for the PLL circuit, it may be desirable that a request characteristic is satisfied that is specific to the PLL circuit, and in which the difference between the charge current and the discharge current is small, and the charge current and the discharge current are changed in the same direction by the same amount.

Figure 1B:
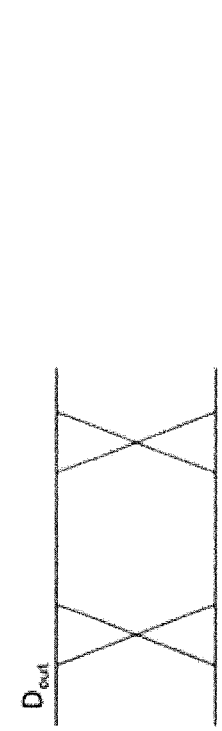
FIG. 1B illustrates an example of reception timing of input data.
Figure 1C:
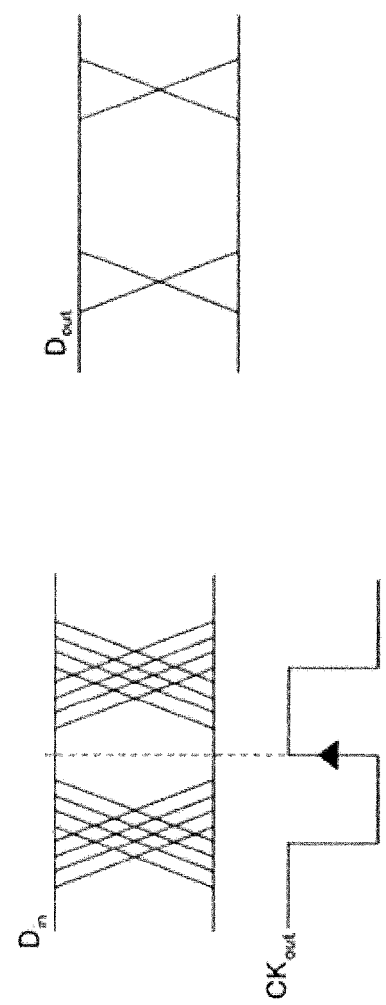
FIG. 1C illustrates an example of captured data.

FIG. 1A illustrates an example of a reception circuit. The reception circuit illustrated in FIG. 1A may be a reception circuit that includes a PLL-type clock-data recovery (CDR) circuit. FIG. 1B illustrates an example of reception timing of input data. FIG. 1C illustrates an example of captured data.

The reception circuit illustrated in FIG. 1A includes a PLL circuit 10 and a determination circuit 11. The PLL circuit 10 includes a phase detector (PD) 21, a charge pump (CP) 22, a loop filter 23, and a voltage control oscillator (VCO) 24. The PD 21 detects a phase difference between an input signal $D_{in}$ and a reception clock $CK_{out}$, and outputs phase difference information to the CP 22. The CP 22 generates a charge signal in accordance with the phase difference information. The loop filter 23 removes a high-frequency component from the charge signal, and outputs a voltage control signal, to the VCO 24. The VCO 24 generates a reception clock $CK_{out}$ in accordance with the voltage control signal. The determination circuit 11 includes, for example, a latch circuit such as a D-type flip flop (D-FF), and captures the input data $D_{in}$ in accordance with the reception clock $CK_{out}$.

As illustrated in FIG. 1B, the reception clock $CK_{out}$ does not rise at timing at which the width of an eye pattern of the input data $D_{in}$ that is input to the reception circuit becomes the largest, and the rise of the reception clock $CK_{out}$ may be shifted from desired timing. Therefore, in the PLL circuit 10, the phase difference between the input signal $D_{in}$ and the reception clock $CK_{out}$, which has been detected by the PD 21, is controlled so as to become a desired difference by feedback control. In the state in which the PLL circuit is stable, as illustrated in FIG. 1C, a relationship between rise timing of the input signal $D_{in}$ and rise timing of the reception clock $CK_{out}$ are fixed, and the data is captured at the desired timing. The timings of the output data $D_{out}$ and the reception clock $CK_{out}$ are fixed, so that the phase fluctuation is reduced, and jitter may be removed.

The current mirror circuit may be used for a charge pump circuit or the like that is used for a PLL circuit, a PLL-type CDR circuit, or the like, a further circuit or the like.

Figure 2A:
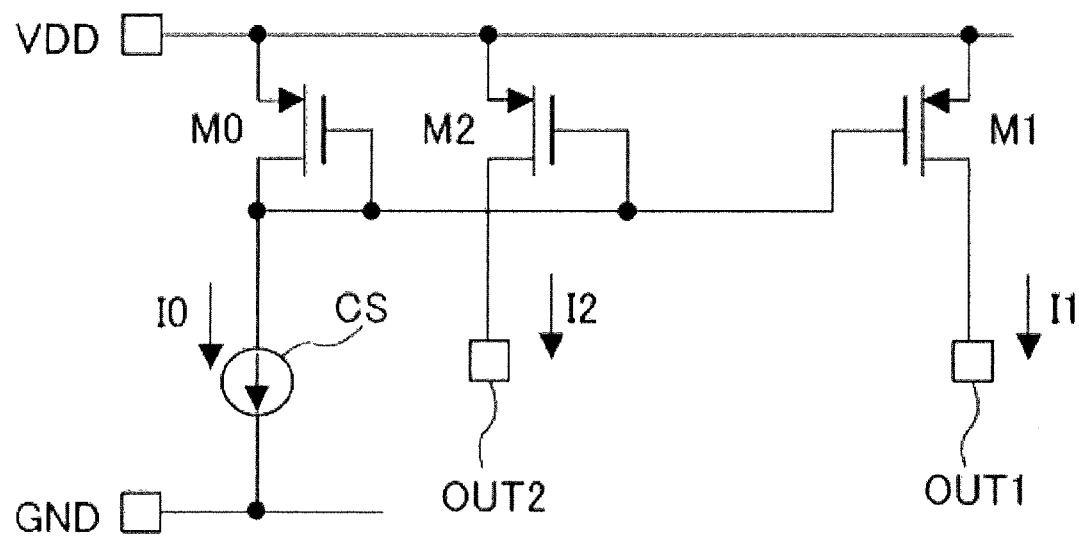
FIG. 2A illustrates an example of a current mirror circuit.
Figure 2B:
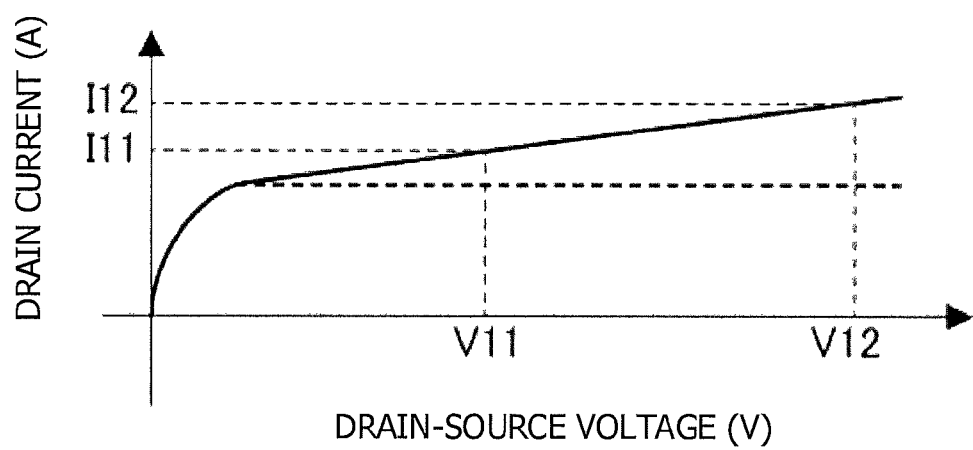
FIG. 2B illustrates an example of output (drain) current characteristics for drain-source voltage.

FIG. 2A illustrates an example of a current mirror circuit. FIG. 2B illustrates an example of output (drain) current characteristics for drain-source voltage. The characteristics illustrated in FIG. 2B may be characteristics of a transistor that is used for the current mirror circuit illustrated in FIG. 2A.

The current mirror circuit illustrated in FIG. 2A includes a reference current circuit, a first proportional current circuit, and a second proportional current circuit. The reference current circuit includes a reference transistor M0 and a constant current source CS that are coupled in series between a high potential source VDD and a low potential source GND. The first proportional current circuit includes a first transistor M1 that is connected to the VDD so as to form a current mirror circuit with the reference transistor M0, and generates current having a first ratio to current of the reference current circuit. The second proportional current circuit includes a second transistor M2 that is coupled to the VDD so as to form a current mirror circuit with the reference transistor M0, and generates current having a second ratio to the current of the reference current circuit. Output current I1 having the first ratio is output to an output terminal OUT1 from the drain of the M1, and output current I2 having the second ratio is output to an output terminal OUT2 from the drain of the M2. For example, the first ratio and the second ratio are substantially the same, and for example, the first ratio and the second ratio may not be the same.

In the current mirror circuit, when the same gate-source voltage is applied to FET transistors having a certain size ratio, currents having the substantially the same current ratio as the size ratio flow. The current mirror circuit generates the currents I1 and I2 that are the same ratio to the current I0 that flows through the reference current circuit using this principle. In the current mirror circuit illustrated in FIG. 2A, a connection node between the M0 and the constant current source CS is coupled to the gates of the M0, the M1 and the M2. In FIG. 2A, p-type FETs are used, but n-type FETs may be used, and bipolar transistors may be used. The current mirror circuit may be a circuit element that is widely used for various circuits. For example, the M0, the M1 and the M2 illustrated in FIG. 2A may be the p-type FETs.

In the ideal transistor, it is assumed that current that flows through the transistor does not affected by the drain-source voltage. In the current mirror circuit illustrated in FIG. 2A, regardless of the potentials of the OUT1 and the OUT2, it may be expected that the currents I1 and I2 are substantially the same. For example, as illustrated in FIG. 2B, the drain current depends on the drain-source voltage, so that a difference may occur between the pieces of current I1 and I2 due to the potentials of the OUT1 and the OUT2. Such a characteristic is called a channel length modulation effect of a transistor. For example, the drain current is increased as the drain-source voltage becomes larger. In a case in which "V11<V12" is satisfied, when the drain current at the time at which the drain-source voltage is at "V11" is "I11", and the drain current at the time at which the drain-source voltage is at "V12" is "I12", "I11<I12" is satisfied. As described above, in the current mirror circuit illustrated in FIG. 2A, a difference may occur between the currents I1 and I2 due to the potentials of the OUT1 and the OUT2.

Figure 3A:
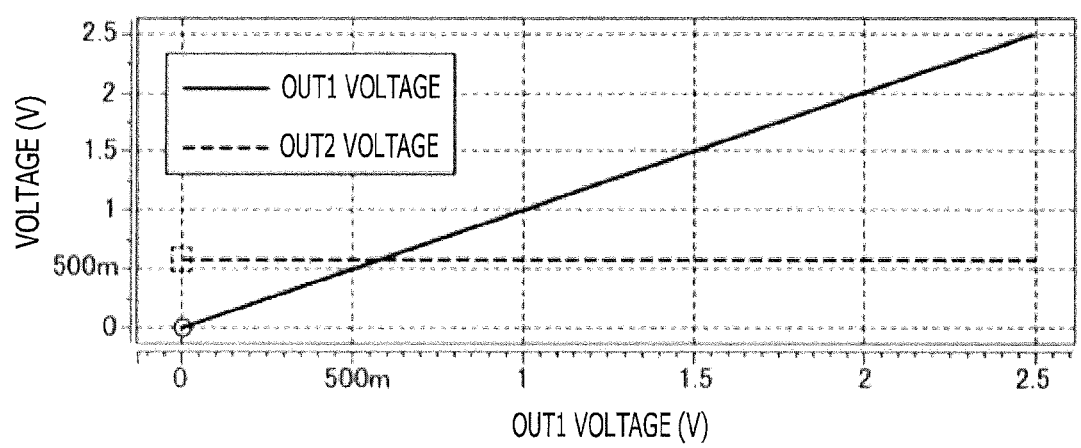
FIGS. 3A and 3B illustrate an example of current mirror characteristics.
Figure 3B:
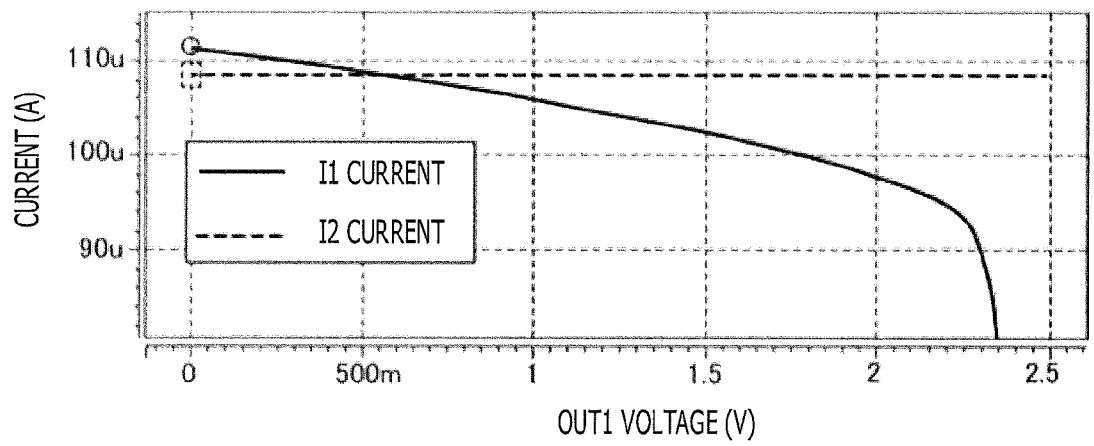

FIGS. 3A and 3B illustrate an example of current mirror characteristics. In each of FIGS. 3A and 3B, current mirror characteristics which indicate a symmetry of outputs of the current mirror circuit illustrated in FIG. 2A is illustrated. FIG. 3A illustrates characteristic of a voltage, and FIG. 3B illustrates characteristic of a current. FIG. 3A illustrates voltage of the OUT1 and voltage of the OUT2 when the voltage of the OUT2 is maintained substantially constant, and the voltage of the OUT1 is changed. The solid line indicates the voltage of the OUT1, and the broken line illustrates the voltage of the OUT2. FIG. 3B illustrates I1 from the OUT1 and I2 from the OUT2 when the voltage of the OUT2 is maintained substantially constant, and the voltage of the OUT1 is changed. The solid line indicates the I1 of the OUT1, and the broken line indicates the I2 of the OUT2.

As illustrated in FIGS. 3A and 3B, the voltage of the output terminal OUT2 is maintained substantially constant, so that the I2 is also substantially fixed. In contrast, the voltage of the OUT1 is changed along the straight line of slope 1, and the I1 is decreased in accordance with an increased in the voltage of the OUT1, and is decreased sharply at certain voltage or more. As described above, the I1 and the I2 are not the same.

Figure 4:
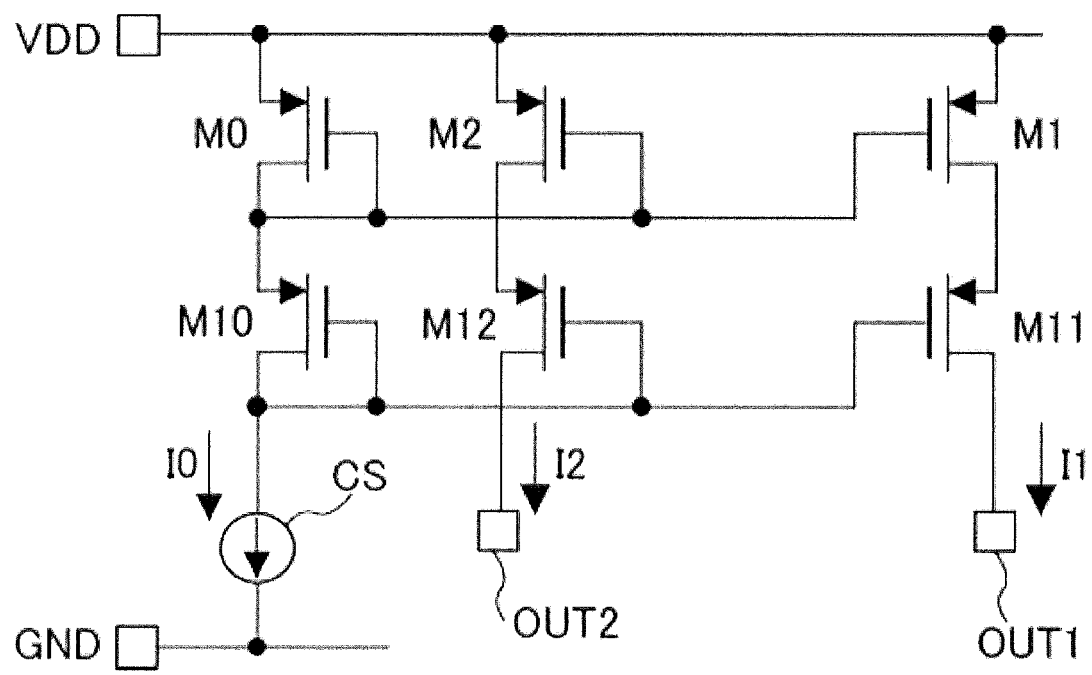
FIG. 4 illustrates an example of a current mirror circuit.

FIG. 4 illustrates an example of a current mirror circuit. The current mirror circuit illustrated in FIG. 4 has a configuration by which the channel length modulation effect of a transistor is suppressed.

In the current mirror circuit illustrated in FIG. 4, a reference auxiliary transistor M10 is coupled between the M0 and the constant current source CS of the circuit illustrated in FIG. 2A, and a first auxiliary transistor M11 is coupled between the M1 and the OUT1 of the circuit illustrated in FIG. 2A, and a second auxiliary transistor M12 is coupled between the M2 and the OUT2 of the circuit illustrated in FIG. 2A. For example, the current mirror circuit in FIG. 4 has a cascode structure in which the M10, M11 and M12 are respectively coupled to the M0, M1 and M2. In such a structure, a difference between the I1 and the I2 becomes small, and the corresponding voltage ranges of the OUT1 and the OUT2 may become small.

Figure 5A:
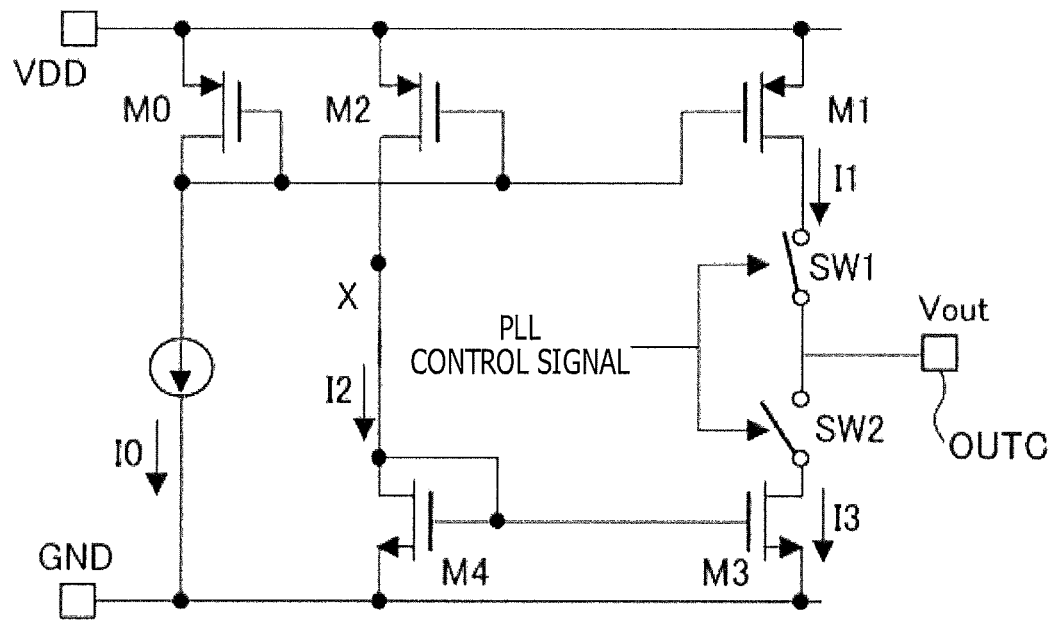
FIGS. 5A and 5B illustrate an example of a charge pump circuit.
Figure 5B:
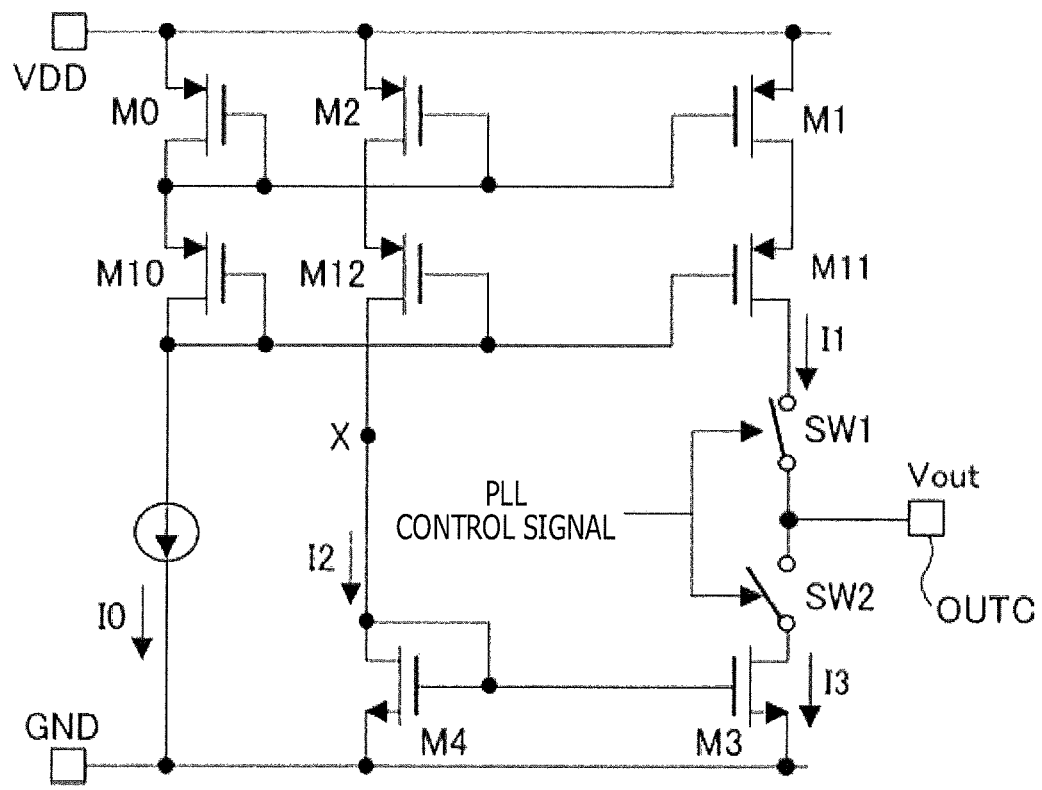

FIGS. 5A and 5B illustrate an example of a charge pump circuit. The charge pump circuits illustrated in FIGS. 5A and 5B are used for a PLL circuit and the like. FIG. 5A illustrates a circuit that uses the current mirror circuit illustrated in FIG. 2A. FIG. 5B illustrates a circuit that uses the current mirror circuit illustrated in FIG. 4. In FIGS. 5A and 5B, the drain of the M2 is indicated by the point X.

In the charge pump circuit illustrated in FIG. 5A, a first switch SW1, a second switch SW2, and a third transistor M3 are coupled in series between the M1 and the GND of the current mirror circuit of FIG. 2A, and a fourth transistor M4 is coupled between the M2 and the GND of the current mirror circuit of FIG. 2A. The M3 and the M4 are n-type FETs, and the gates of the M3 and the M4 are coupled to the drain of the M2 in common, and the M3 and the M4 forms a current mirror circuit. Therefore, current I3 that flows through the M3 is substantially the same as current that flows through the M4. The current that flows through the M4 is substantially the same as the current that flows through the M2 (drain current I2). The I1 that flows through the M1 is substantially the same as the I2, so that "I3=I1" is satisfied.

When the charge pump circuit of FIG. 5A is used as a charge pump (CP) 22 of the PLL circuit, the SW1 and the SW2 are controlled in accordance with the phase difference information (PLL control signal) that is output from the PD 21. For example, the connection of the SW1 is established and a PLL control signal that is used to interrupt the connection of the SW2 is input when the phase is delayed, and the connection of the SW1 is interrupted and a PLL control signal that is used to establish the connection of the SW2 is input when the phase is advanced. When the connection of the SW1 is established and the connection of the SW2 is interrupted, the charge current I1 that causes the current to flow into the output terminal OUTC from the VDD is output. When the connection of the SW1 is interrupted, and the connection of the SW2 is established, the current I3 is drawn from the output terminal OUTC to the GND. Such a characteristic may be called output of discharge current. The voltage of the output terminal OUTC is represented as "Vout".

In the charge pump circuit illustrated in FIG. 5B, the SW1, the SW2, the M3, and the M4 of FIG. 5A are added to the current mirror circuit having the cascade structure of FIG. 4.

Figure 6A:
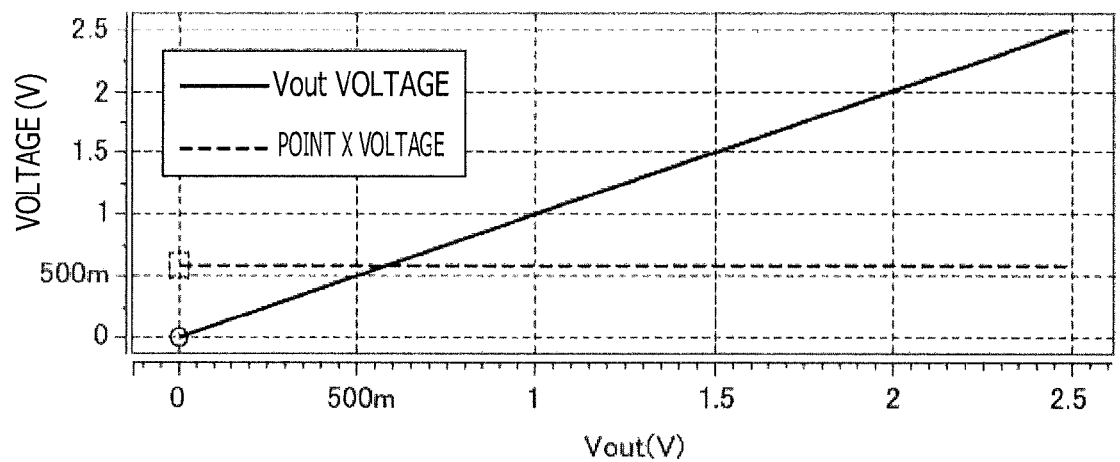
FIGS. 6A and 6B illustrate an example of symmetry of an output.
Figure 6B:
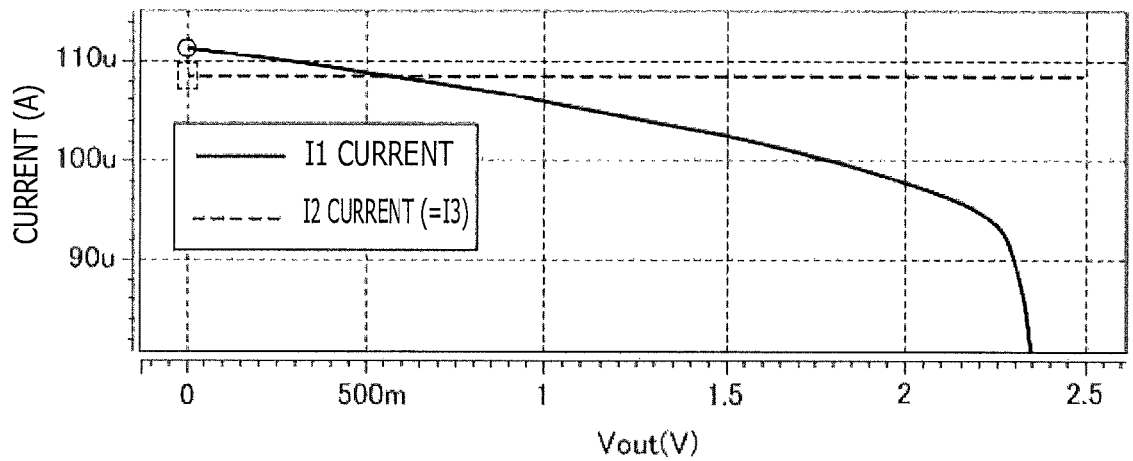

FIGS. 6A and 6B illustrate an example of symmetry of an output. In FIGS. 6A and 6B, the symmetry of the output in the charge pump circuit illustrated in FIG. 5A are illustrated. FIG. 6A illustrates characteristics of voltage, and FIG. 6B illustrates characteristics of current. FIG. 6A illustrates the voltage Vout and the voltage at the point X when the voltage at the point X is substantially fixed, and the voltage Vout of the OUTC is changed. The solid line indicates the Vout, and the broken line indicates the voltage of the point X. FIG. 6B illustrates the charge current I1 from the OUTC and the current I2 at the point X (=discharge current I3 to the OUTC) when the voltage at the point X is maintained substantially constant, and the voltage Vout of the OUTC is changed. The solid line indicates the I1, and the broken line indicates the I2 (=I).

As illustrated in FIGS. 6A and 6B, the voltage at the point X is substantially fixed, so that the I2 is also substantially fixed, and the I3 is substantially fixed. In contrast, the voltage Vout of the OUTC is changed along the straight line of the slope 1, and the I1 is decreased in accordance with the increase in the Vout and decreased sharply at certain voltage or more. As described above, the I1 and the I2 (=I3) are not the same.

In the PLL circuit 10 illustrated in FIG. 1A, the control voltage of the VCO 24 is generated by the CP 22, so that a control characteristic of the PLL circuit highly depends on the charge current (the charge and discharge currents) that is output from the CP 22. In the PLL circuit, the charge current I1 and the discharge current I3 may be substantially the same. When there is a difference between the I1 and the I3, the stability of loop lock of the PLL circuit is reduced, so that the phase may not be locked.

In the charge pump circuit illustrated in FIG. 5A, the Vout is changed depending on the output value. As illustrated in FIG. 6, when the Vout is considerably different from the potential at the point X, a difference occurs between the drain-source voltages of the M1 and the M2, and the I1 and the I2, and the I1 and the I3 may not become equal. For example, in the state in which the Vout gets closer to the VDD or the GND, the difference between the I1 and the I3 becomes large, and the charge and discharge are not allowed to be performed, so that the operation as the charge pump may not be performed. Therefore, the operation range of the VCO control voltage that occurs in the OUTC may be narrowed.

For example, when the operation range of the VCO control voltage is limited, the stabilization is obtained, but the sync frequency range may be reduced, and the phase noise of the VCO may be increased.

In the charge pump circuit having the cascode structure, which is illustrated in FIG. 5B, the current ratios of the I1 and the I3 are not equal, but the operation range of the OUTC may be narrowed. Therefore, similar to the above-description, the operation range of the VCO is limited, and the sync frequency range is reduced, so that the phase noise of the VCO may be increased.

Figure 7A:
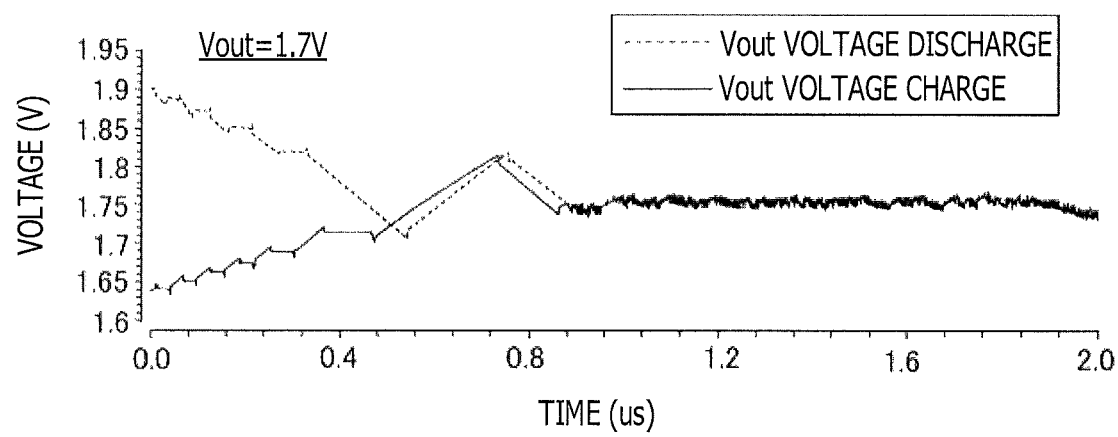
FIGS. 7A and 7B illustrate an example of Vout.
Figure 7B:
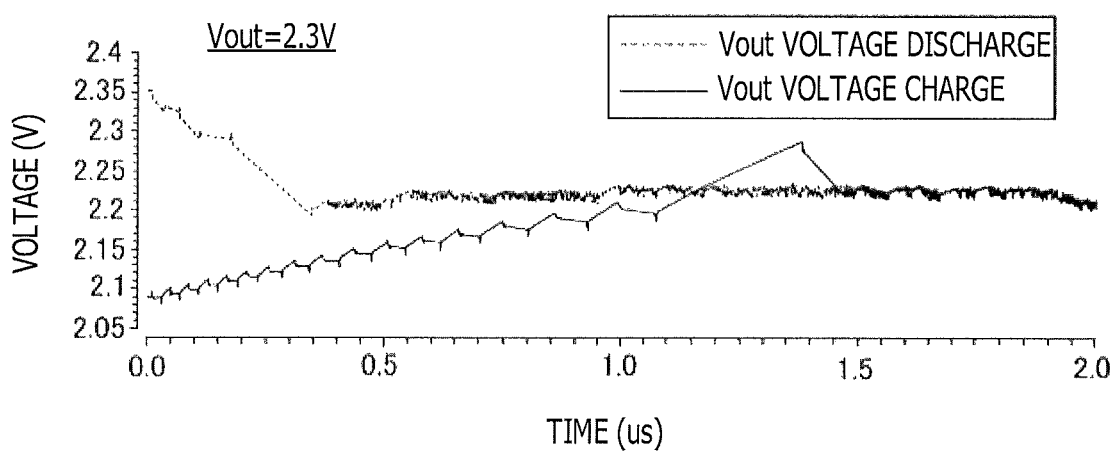

FIGS. 7A and 7B illustrate an example of Vout. Each of FIGS. 7A and 7B illustrate a change in the Vout in a charge and discharge operations of the charge pump until the voltage are stabilized in the PLL circuit using the charge pump circuit of FIG. 5A. FIG. 7A illustrates a case in which the voltages are stabilized when "Vout=1.7V" is satisfied. FIG. 7B illustrates a case in which the voltages are stabilized when "Vout=2.3V" is satisfied. In FIGS. 7A and 7B, the solid line indicates a change in the Vout in the charge operation from the OUTC, and the broken line indicates a change in the Vout in the discharge operation.

When the charge pump circuit illustrated in FIG. 5A is used for the PLL circuit, the I1 and the I3 may be substantially the same. However, the potential at the point X is maintained substantially constant regardless of the Vout, but the I1 and the I3 may become asymmetrical depending on the control voltage value of the VCO because the Vout fluctuates depending on the output value. The asymmetry becomes small when the Vout is stabilized at 1.7V as illustrated in FIG. 7A, but the asymmetry may become large when the Vout is stabilized at 2.3V as illustrated in FIG. 7B. The asymmetry affects the loop characteristic of the PLL circuit and the CDR circuit, and the characteristic may be deteriorated. In the worst case, the charge and discharge operations are not allowed to be performed, and the PLL circuit may not be operated.

When a difference occurs between the I1 (charge current) and the I3 (discharge current), the PLL characteristic may be deteriorated, but the impact may be small when the I1 and the I3 are changed in the same direction by the same amount. Therefore, in the charge pump that is used for the PLL circuit, a characteristic of the PLL circuit, in which the difference between the I1 and the I3 is small, and the I1 and the I3 are changed in the same direction by the same amount, may be requested.

Figure 8A:
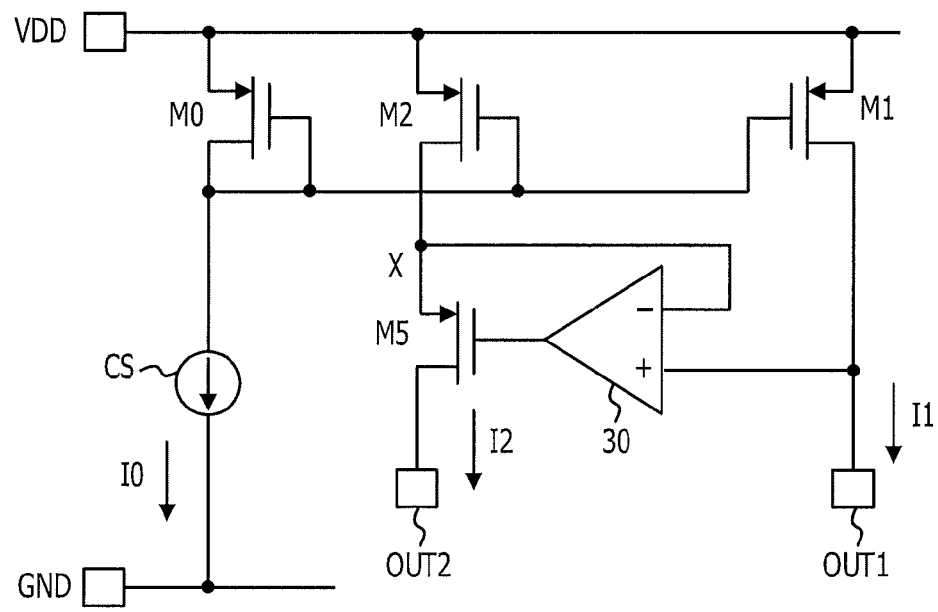
FIG. 8A and FIG. 8B illustrate an example of a current mirror circuit.
Figure 8B:
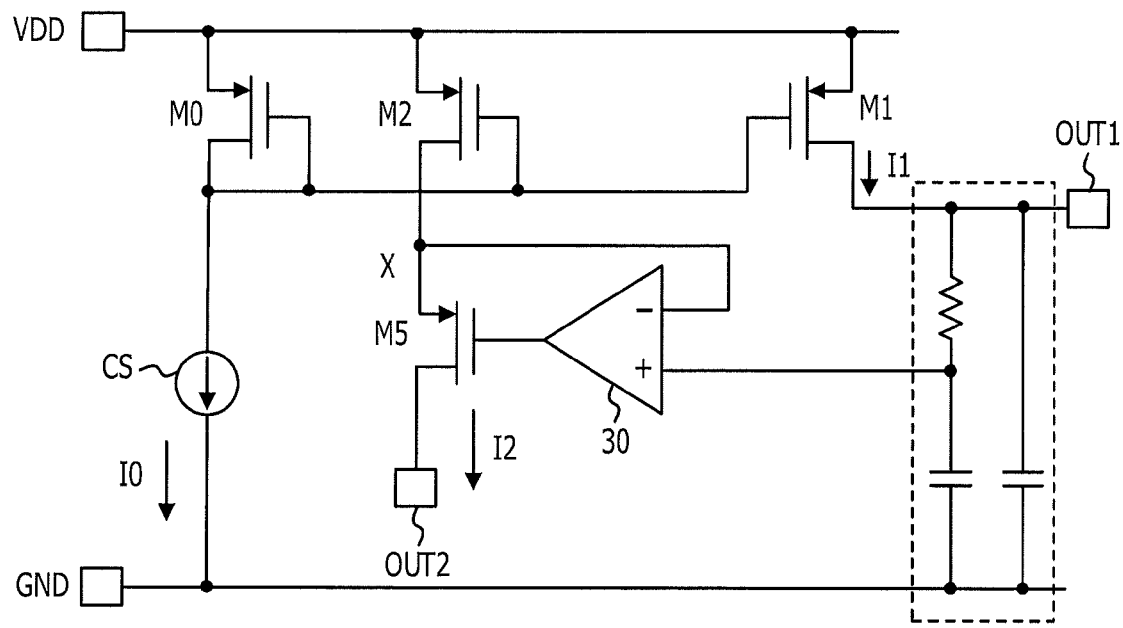

FIG. 8A and FIG. 8B illustrate an example of a current mirror circuit. The current mirror circuits illustrated in FIG. 8A and FIG. 8B include a reference current circuit, a first proportional current circuit, a second proportional current circuit, and a comparison circuit 30. In the current mirror circuit in FIG. 8B, a loop filter which is surrounded by a dotted line is added at an output part. The reference current circuit includes a reference transistor M0 and a constant current source CS that are coupled in series between a high potential source VDD and a low potential source GND. The first proportional current circuit includes a first transistor M1 that is coupled to the high potential source VDD so as to forms a current mirror circuit with the reference transistor M0, and generates current having a first ratio to current of the reference current circuit. The second proportional current circuit includes a second transistor M2 that is coupled to the high potential source VDD so as to form a current mirror circuit with the reference transistor M0, and a current adjustment transistor M5 that is coupled to the drain (point X) of the M2, and in which an output of the comparison circuit 30 is applied to the gate. The M0, the M1, and the M2 may be p-type FETs. The second proportional current circuit generates current having a second ratio to the current of the reference current circuit. The comparison circuit 30 includes an operational amplifier, a comparator, and the like, and performs output of a difference between the voltage of the drain of the M1 and the voltage of the drain (point X) of the M2. The output current I1 having the first ratio is output to the output terminal OUT1 from the drain of the M1, and the output current I2 having the second ratio is output to the output terminal OUT2 from the drain of the M5.

For example, the current mirror circuit illustrated in FIG. 8A and FIG. 8B may have a configuration in which the comparison circuit 30 and the current adjustment transistor M5 are added to the current mirror circuit illustrated in FIG. 2A. The conduction state of the M5 is changed depending on a difference between the voltage of the drain of the M1 and the voltage of the drain (point X) of the M2, which are output from the comparison circuit 30. Therefore, even when the potentials are different between the output terminals OUT1 and OUT2, the feedback control is performed so that the voltage of the drain of the M1 and the voltage of the drain (point X) of the M2 become substantially equal. The voltage of the drain of the M1 and the voltage of the drain (point X) of the M2 are substantially equal, so that the drain current I1 of the M1 and the drain current of the M2 may become substantially the same. The drain current I2 of the M2 is equal to the current that passes through the M3, for example, the drain current I3 of the M3, and "I1=I2" may be satisfied.

Figure 9A:
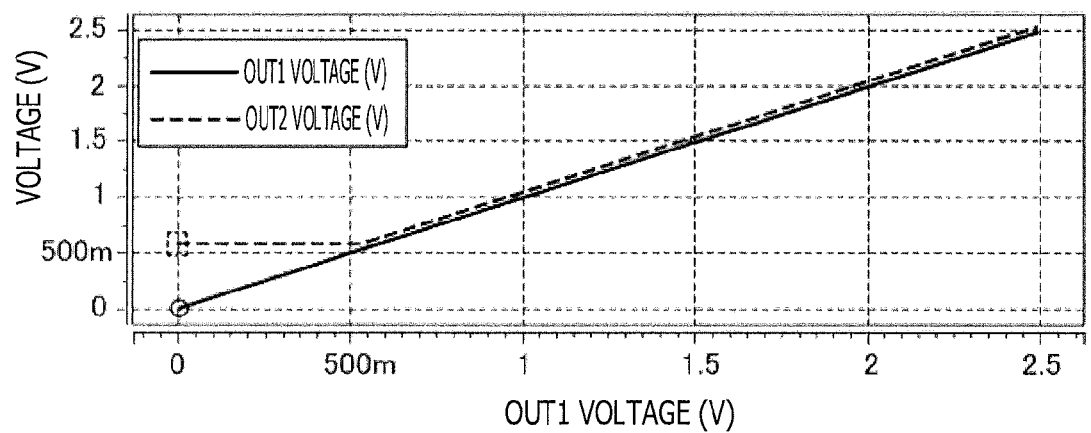
FIGS. 9A and 9B illustrate an example of current mirror characteristics.
Figure 9B:
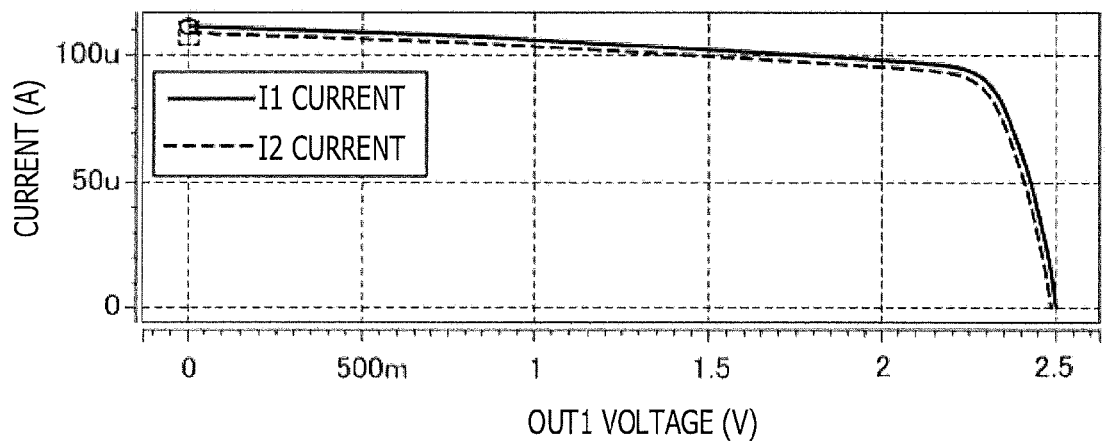

FIGS. 9A and 9B illustrate an example of current mirror characteristics. In FIGS. 9A and 9B, current mirror characteristics which indicate the symmetry of the output in the current mirror circuit illustrated in FIG. 8 are illustrated. FIG. 9A illustrates characteristics of voltage, and FIG. 9B illustrates characteristics of current. FIG. 9A illustrates voltage of the output terminal OUT1 and voltage of the output terminal OUT2 when the voltage of the output terminal OUT2 is maintained substantially constant and the voltage of the output terminal OUT1 is changed. The solid line indicates the voltage of the output terminal OUT1, and the broken line indicates the voltage of the output terminal OUT2. When the voltage of the OUT1 is 500 mV or more, the solid line and the broken line are substantially overlapped with each other. FIG. 9B illustrates current I1 from the output terminal OUT1 and current I2 from the output terminal OUT2 when the voltage of the output terminal OUT2 is substantially fixed and the voltage of the output terminal OUT1 is changed. The solid line indicates the current I1 of the output terminal OUT1, and the broken line indicates the current I2 of the output terminal OUT2 I2. The solid line and the broken line are slightly shifted from each other when the voltage of the OUT1 is less than 500 mV, but the solid line and the broken line are substantially overlapped with each other when the voltage of the OUT1 is 500 mV or more. For example, even when the voltage of the output terminal OUT1 fluctuates, the I1 and the I2 may be substantially the same.

In the current mirror circuit illustrated in FIG. 2A, when the potential of the output terminal OUT1 fluctuates as illustrated in FIG. 3B, a difference may occur between the I1 and the I2. In the current mirror circuit illustrated in FIG. 8, as illustrated in FIGS. 9A and 9B, even when the potential of the output terminal OUT1 fluctuates, the I1 and the I2 may be substantially the same.

Figure 10A:
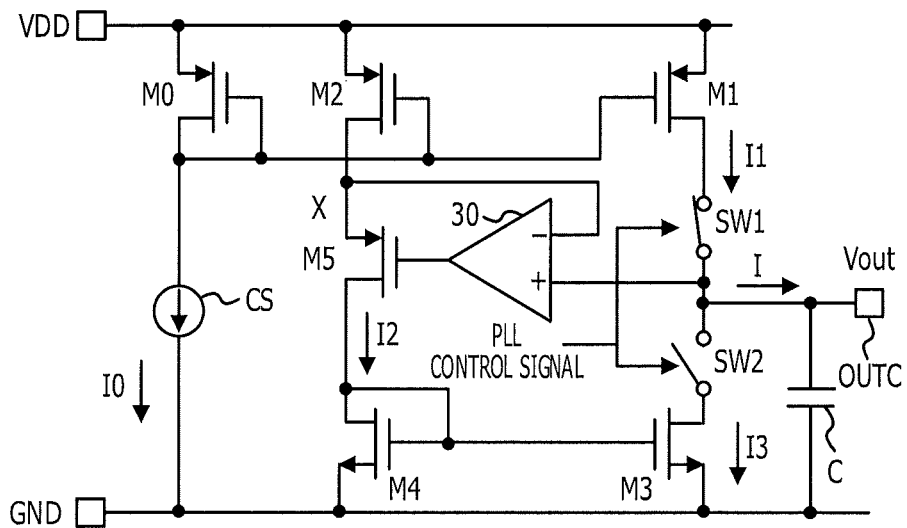
FIG. 10A and FIG. 10B illustrate an example of a charge pump circuit.
Figure 10B:
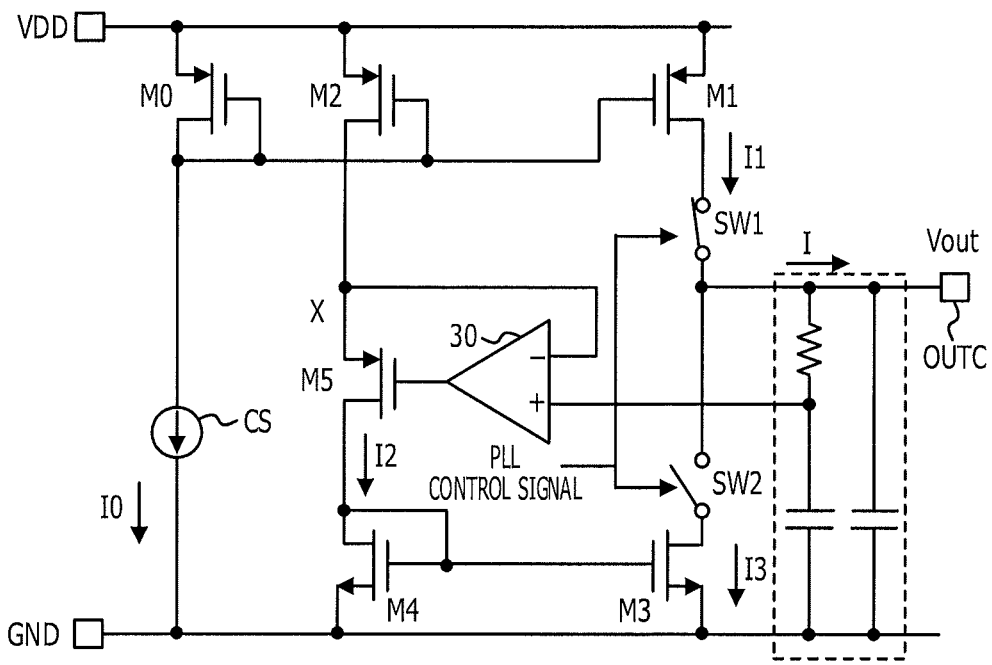

FIG. 10A and FIG. 10B illustrate an example of a charge pump circuit. In FIG. 10, the drain of a second transistor M2 is indicated by the point X. The charge pump circuits illustrated in FIG. 10A and FIG. 10B include a reference current circuit, a first proportional current circuit, a second proportional current circuit, and a comparison circuit 30. In the charge pump circuit in FIG. 10B, a loop filter which is surrounded by a dotted line is added at an output part. The reference current circuit includes a reference transistor M0 and a constant current source CS that are coupled in series between a high potential source VDD and a low potential source GND. The first proportional current circuit includes a first transistor M1 and a third transistor M3, which have different polarities and are coupled in series between the VDD and the GND so that the M1 forms a current mirror circuit with the M0, and generates current having a first ratio to a current of the reference current circuit. The second proportional current circuit includes the second transistor M2 and a fourth transistor M4, which have different polarities and are coupled in series between the VDD and the GND so that the M2 forms a current mirror circuit with the M0, and generates current having a second ratio to the current of the reference current circuit. The M0, the M1 and the M2 may be p-type FETs, and the M3 and the M4 may be n-type FETs. The comparison circuit 30 includes an operational amplifier, a comparator, and the like, and outputs a difference between the voltage of the drain of the M1 and the voltage of the drain (point X) of the M2. The second proportional current circuit includes a current adjustment transistor M5 having the same polarity as the M2, which is coupled between the M2 and the M4 and has a gate to which an output of the comparison circuit 30 is applied, for example, a p-type polarity. The first proportional current circuit includes a first switch SW1 and a second switch SW2 that are coupled in series between the M1 and the M3. The gates of the M3 and the M4 are coupled to the drain of the M4, and the M3 and the M4 may form a current mirror circuit. The charge current I1 having the first ratio and the discharge current I2 are input and output from and to the connection node between the SW1 and the SW2 that are coupled to the output terminal OUTC. In FIG. 10, a capacity C that is included in the loop filter 23 of the PLL circuit is illustrated. This capacity C illustrated in FIG. 10A is one example of the loop filter, and the input of the comparison circuit 30 may be acquired not only from the OUTC, but also from any port of the loop filter as illustrated in FIG. 10B. The input of the comparison circuit 30 may be coupled to any port of the loop filter, and this structure may be suitable to suppress the effect of the parasitic capacitor of the input port of the comparison circuit 30 to the output port OUTC caused.

The charge pump circuit illustrated in FIG. 10 may have a configuration in which the comparison circuit 30 and the current adjustment transistor M5 are added to the charge pump circuit of FIG. 5A. The conduction state of the M5 is changed depending on a difference between the voltage of the drain of the M1 and the voltage of the drain (point X) of the M2, which is output from the comparison circuit 30. Therefore, even when the potential of the output terminal OUTC fluctuates, the feedback control is performed so that the voltage of the drain of the M1 and the voltage of the drain (point X) of the M2 are become substantially equal. Since the voltage of the drain of the M1 and the voltage of the drain (point X) of the M2 are substantially the same, the drain current I1 of the M1 and the drain current of the M2 becomes substantially the same (I1=I2) even when the potential of the OUTC fluctuates. In the current mirror circuit, the drain current I2 of the M2 becomes substantially equal to the current that passes through the M3, for example, the drain current I3 of the M3, and therefore "I2=I3" is satisfied. As described above, since "I1=I2" is satisfied, "I1=I3" is satisfied even when the potential of the output terminal OUTC fluctuates.

Figure 11A:
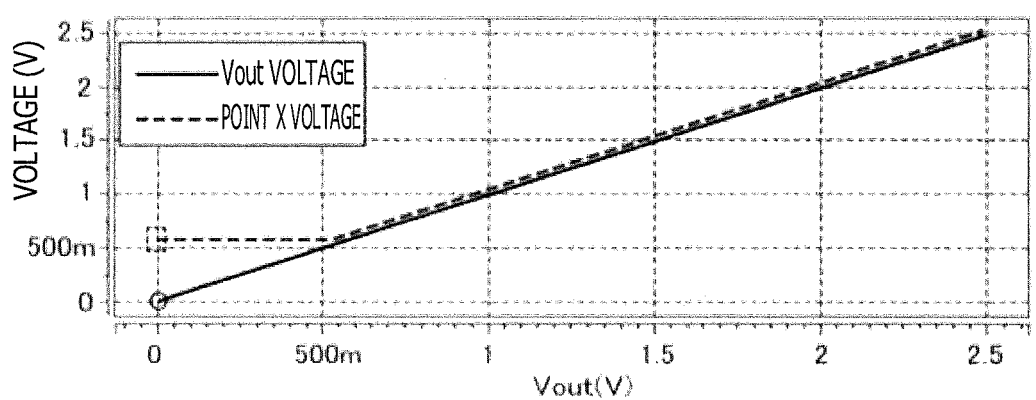
FIGS. 11A and 11B illustrate an example of symmetry of an output.
Figure 11B:
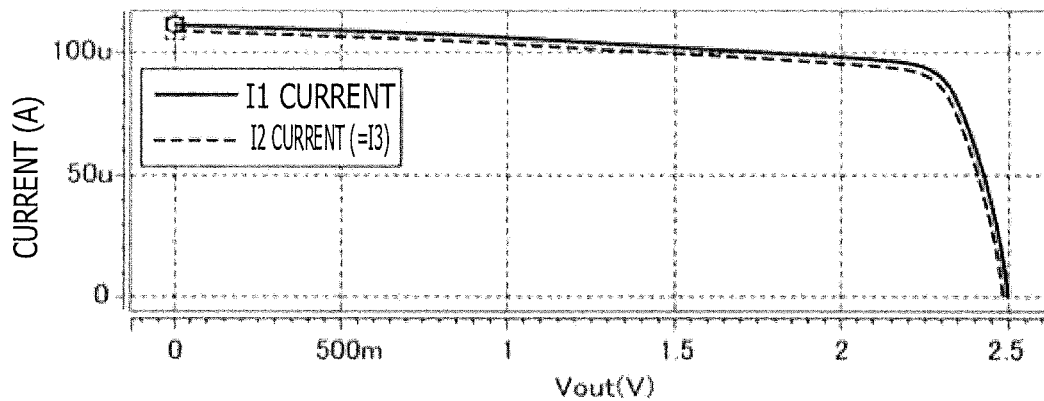

FIGS. 11A and 11B illustrate an example of symmetry of an output. Each of FIGS. 11A and 11B illustrates the symmetry of the output of the charge pump circuit illustrated in FIG. 10. FIG. 11A illustrates characteristics of voltage, and FIG. 11B illustrates characteristics of current. FIG. 11A illustrates voltage Vout and voltage at the point X when the voltage at the point X is maintained substantially constant, and the voltage Vout of the OUTC is changed. The solid line indicates the Vout, and the broken line indicates the voltage at the point X. When the Vout is 500 mV or more, the solid line and the broken line are substantially overlapped with each other. FIG. 11B illustrates charge current I1 from the OUTC and current I2 at the point X (discharge current I3 to the OUTC) when the voltage at the point X is fixed, and the voltage Vout of the OUTC is changed. The solid line indicates the I1, and the broken line indicates the I2 (=I). The solid line and the broken line are slightly shifted to each other when the Vout is less than 500 mV, but the solid line and the broken line are substantially overlapped with each other when the Vout is 500 mV or more. For example, even when the Vout fluctuates, the I1 and the I3 may be substantially the same.

Figure 12A:
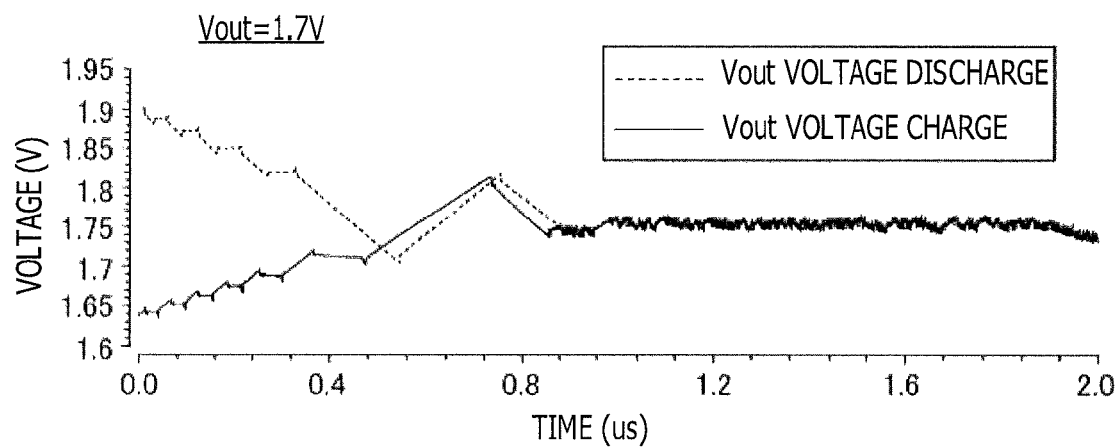
FIGS. 12A and 12B illustrate an example of Vout.
Figure 12B:
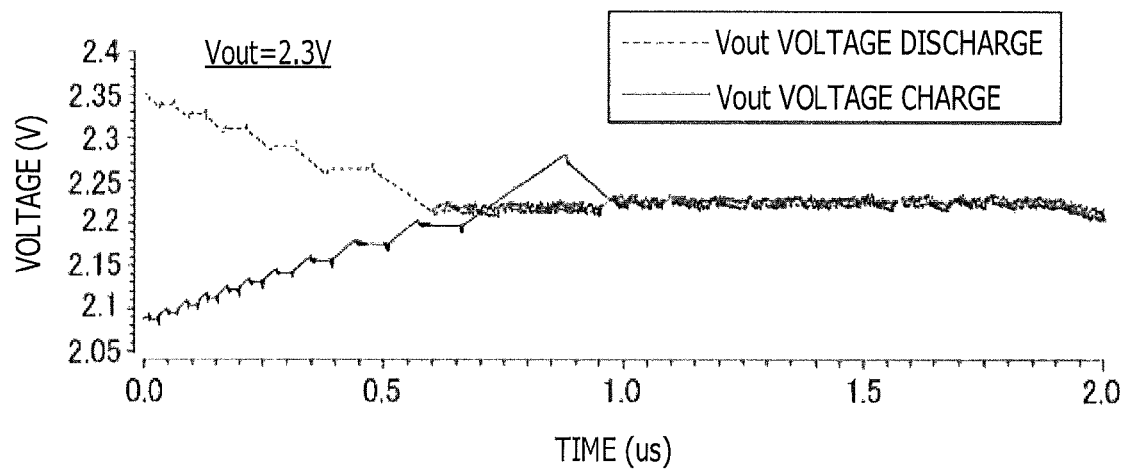

FIGS. 12A and 12B illustrate an example of Vout. Each of FIGS. 12A and 12B illustrates a change in the Vout in the charge and discharge operations of the charge pump until the Vout is stabilized in the PLL circuit using the charge pump circuit illustrated in FIG. 10. FIG. 12A illustrates a case in which the Vout is stabilized at 1.7V. FIG. 12B illustrates a case in which the Vout is stabilized at 2.3V. In FIGS. 12A and 12B, the solid line indicates the change in the Vout in the charge operation from the OUTC, and the broken line indicates the change in the Vout in the discharge operation.

As illustrated in FIGS. 12A and 12B, even in the case of "Vout=1.7V" and "Vout=2.3V", the charge and the discharge are diametrically opposed. When the Vout rises, the I1 is decreased, the I3 is decreased in conjunction with the decrease, the charge current and the discharge current are diametrically opposed. This may be applied to a case in which the Vout is decreased.

In the charge pump circuit of FIG. 5A, as illustrated in FIGS. 6 and 7, when the Vout fluctuates, the difference occurs between the I1 and the I3, and the charge and the discharge may become asymmetrical. In the charge pump circuit illustrated in FIG. 10, even when the Vout fluctuates, the I1 and the I3 are substantially the same, and a difference between the I1 and the I3 is small, so that the charge and the discharge may be diametrically opposed.

In a case in which the charge pump is used for the PLL circuit or the CDR circuit, even when the Vout fluctuates, what is important is that the I1 and the I3 are substantially the same, for example, the charge current and the discharge current are substantially the same, so that the impact of a change in an absolute amount is small. Therefore, for example, an excellent PLL characteristic and an excellent CDR characteristic may be obtained by using the charge pump circuit illustrated in FIG. 10.

Figure 13A:
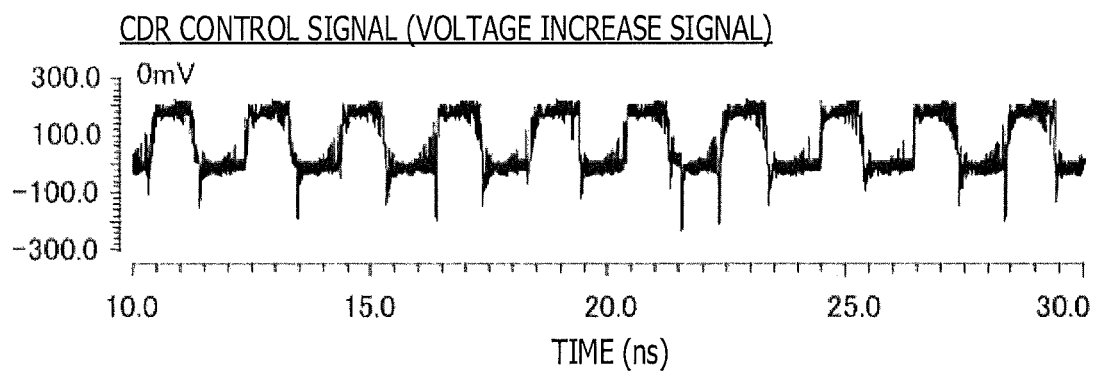
FIGS. 13A, 13B and 13C illustrate an example of a signal.
Figure 13B:
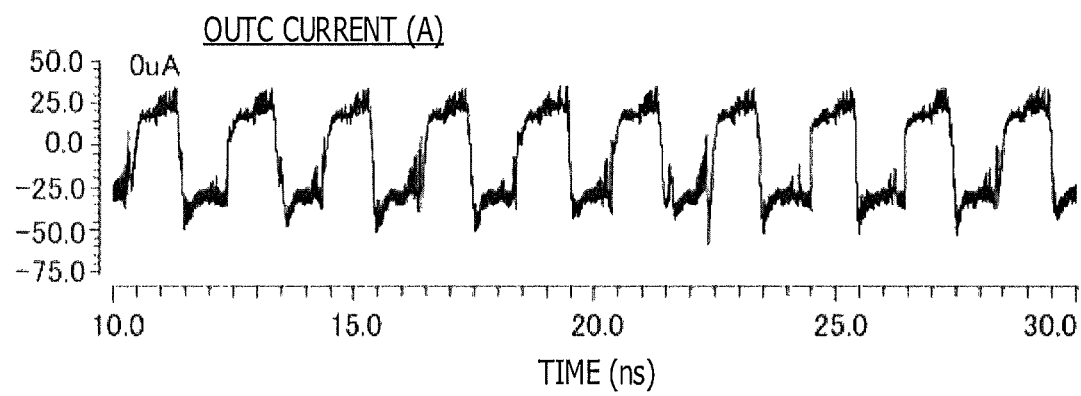
Figure 13C:
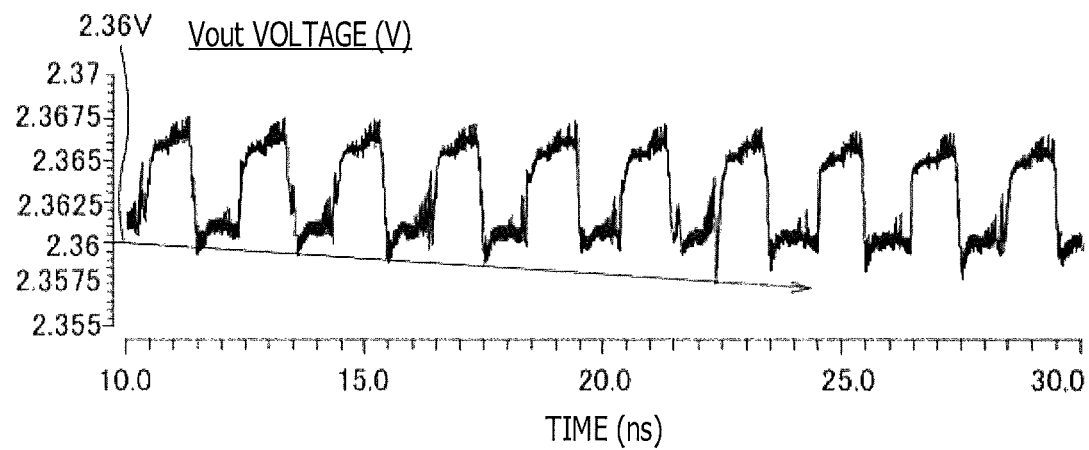

FIGS. 13A, 13B, and 13C illustrate an example of a signal. FIGS. 13A, 13B, and 13C illustrate signal examples of units in a case in which the charge pump circuit illustrated in FIG. 5A operates when the Vout is at around the VDD (here, 2.5V). FIG. 13A illustrates a CDR control signal (that corresponds to a phase difference signal). FIG. 13B illustrates a current of the output terminal OUTC. FIG. 13C illustrates the Vout.

In this case, as illustrated in FIG. 13A, the CDR control signal becomes a large value in a time period of a positive signal that is used to instruct the charge, and exists around "zero". As illustrated in FIG. 13B, even when the CDR control signal is around "zero", an absolute value of the discharge current from the OUTC is relatively large. Therefore, as illustrated in FIG. 13C, the Vout is decreased gradually.

Figure 14A:
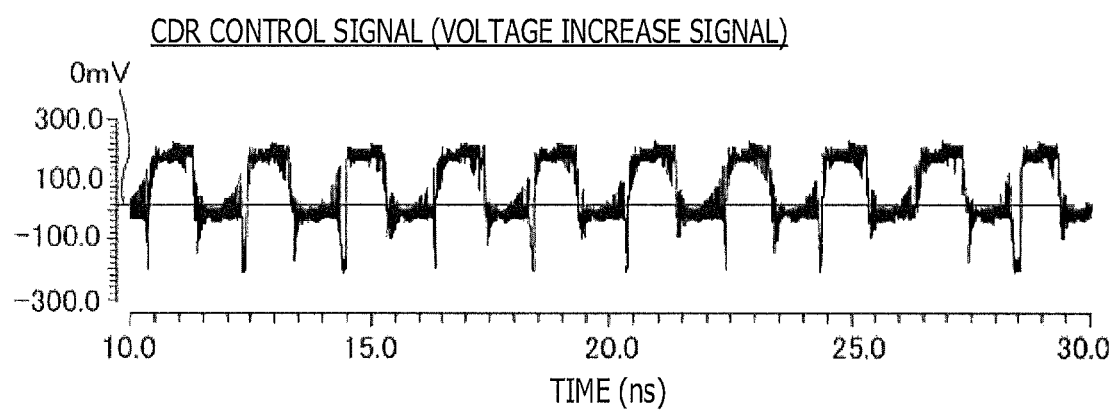
FIGS. 14A, 14B, and 14C illustrate an example of a signal.
Figure 14B:
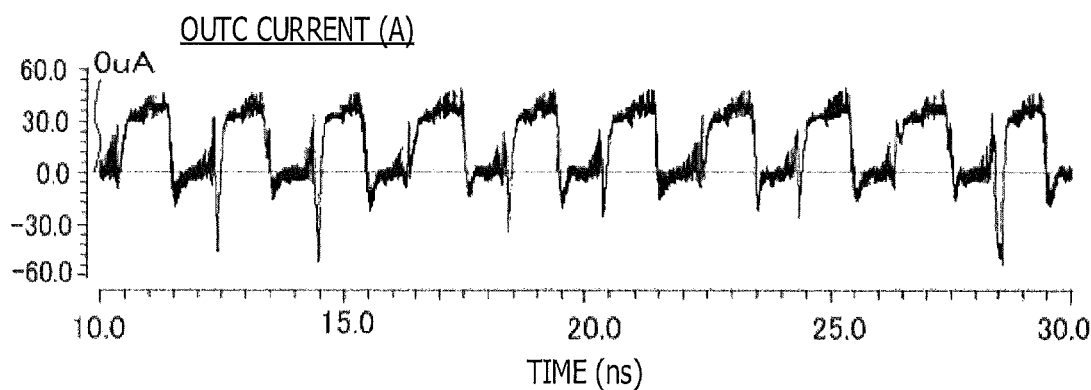
Figure 14C:
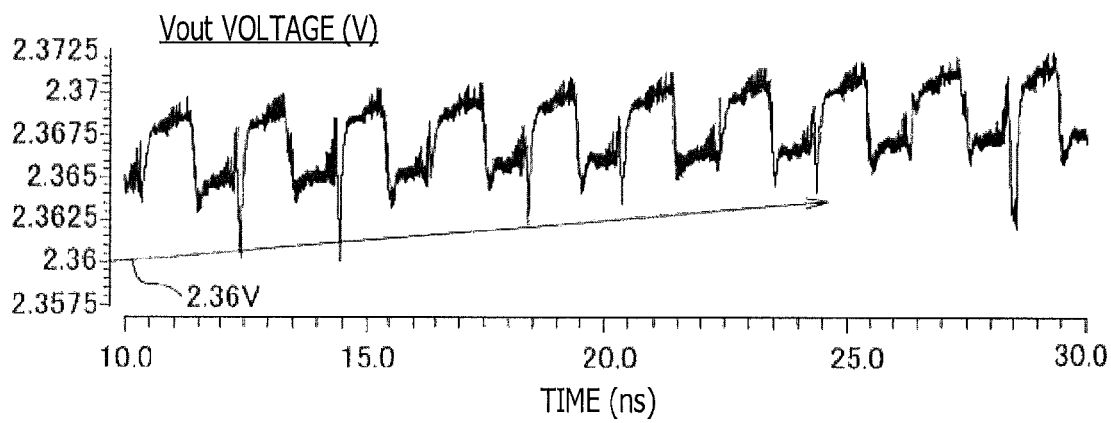

FIGS. 14A, 14B, and 14C illustrate an example of a signal. FIGS. 14A, 14B, and 14C illustrate signal examples of units in a case in which the charge pump circuit illustrated in FIG. 10 operates when the Vout is at around the VDD (here, 2.5V). FIG. 14A illustrates a CDR control signal (corresponding to a phase difference signal). FIG. 14B illustrates current of the output terminal OUTC. FIG. 14C illustrates the Vout.

The CDR control signal illustrated in FIG. 14A is substantially the same as that of FIG. 13A. As illustrated in FIG. 14B, when the CDR control signal is around "zero", an absolute value of the discharge current from the OUTC is approximately "zero". Therefore, as illustrated in FIG. 14C, the Vout is increased gradually, and gets close to a target voltage value.

In the case in which the charge pump circuit illustrated in FIG. 10 is used, the normal operation is performed even when the Vout is at around the VDD, so that the normal operation range of the Vout may be increased.

Figure 15:
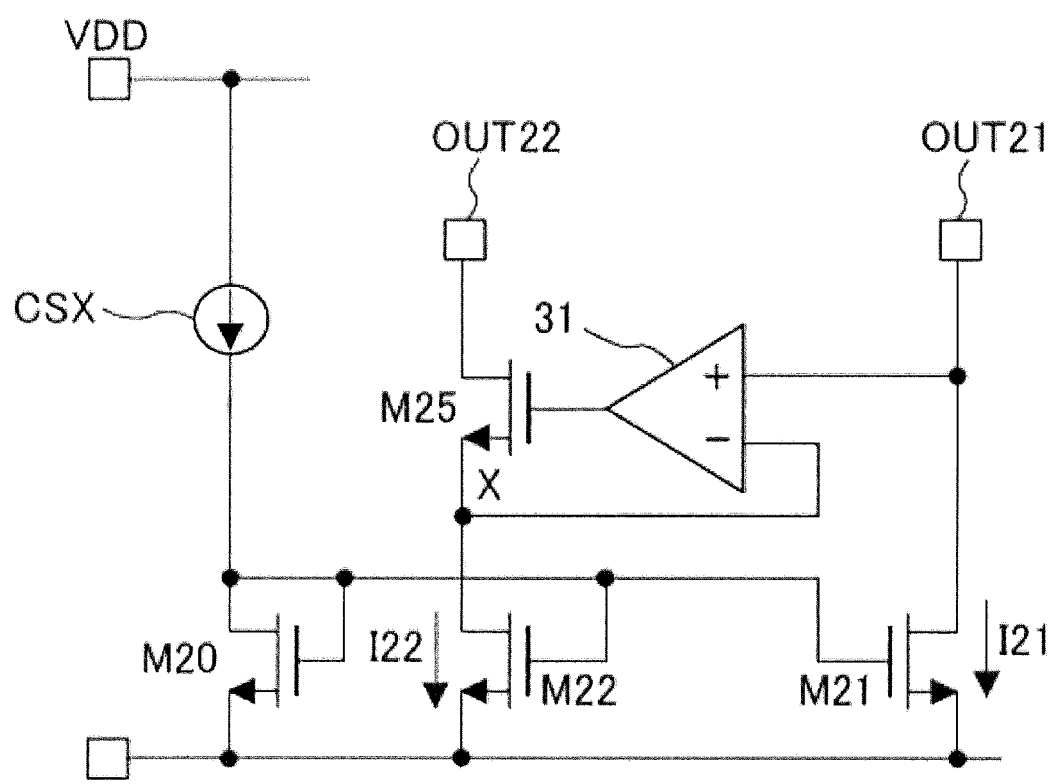
FIG. 15 illustrates an example of a current mirror circuit.

FIG. 15 illustrates an example of a current mirror circuit. In FIG. 8, the p-type FETs are used as the M0, the M1, the M2 and the M5, but n-type FETs may be used. The current mirror circuit illustrated in FIG. 15 may have a configuration in which the polarities of the transistors are inverted for the polarities of the transistors illustrated in FIG. 8, and the elements are arranged and coupled to each other so as to be inverted for the VDD and the GND as compared with FIG. 8. An effect that is substantially the same as or similar to that of the current mirror circuit illustrated in FIG. 8 may be obtained. The current mirror circuit illustrated in FIG. 15 is easily understood from the description of FIG. 8, so that the description may be omitted or reduced herein.

Figure 16:
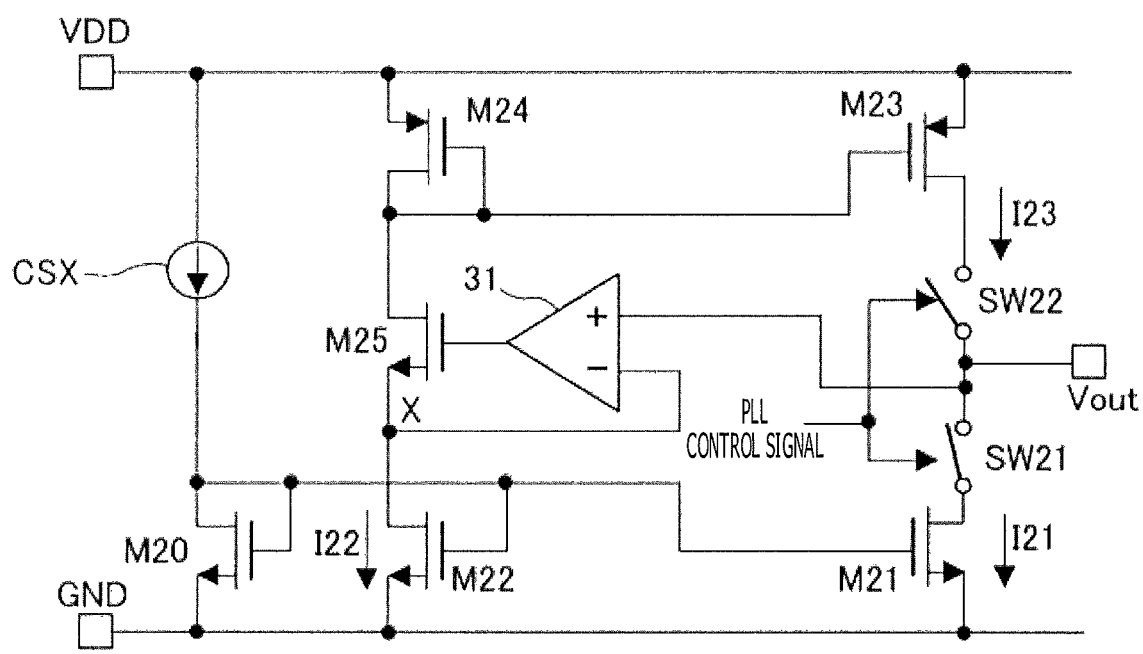
FIG. 16 illustrates an example of a charge pump circuit.

FIG. 16 illustrates an example of a charge pump circuit. As the M0, the M1, the M2, and the M5 illustrated in FIG. 10, the p-type FETs are used, but n-type FETs may be used. As the M3 and the M4, the n-type FETs are used, but p-type FETs may be used. The charge pump circuit illustrated in FIG. 16 may have a configuration in which the polarities of the transistors are inverted for the the polarities of the transistors illustrated in FIG. 10, and the elements are arranged and connected to each other so as to be inverted for the VDD and the GND as compared with FIG. 10, and an effect that is substantially the same as or similar to that of the current mirror circuit illustrated in FIG. 10 may be obtained. The charge pump circuit illustrated in FIG. 16 is easily understood from the description of FIG. 10, so that the description may be omitted or reduced herein.

Figure 17:
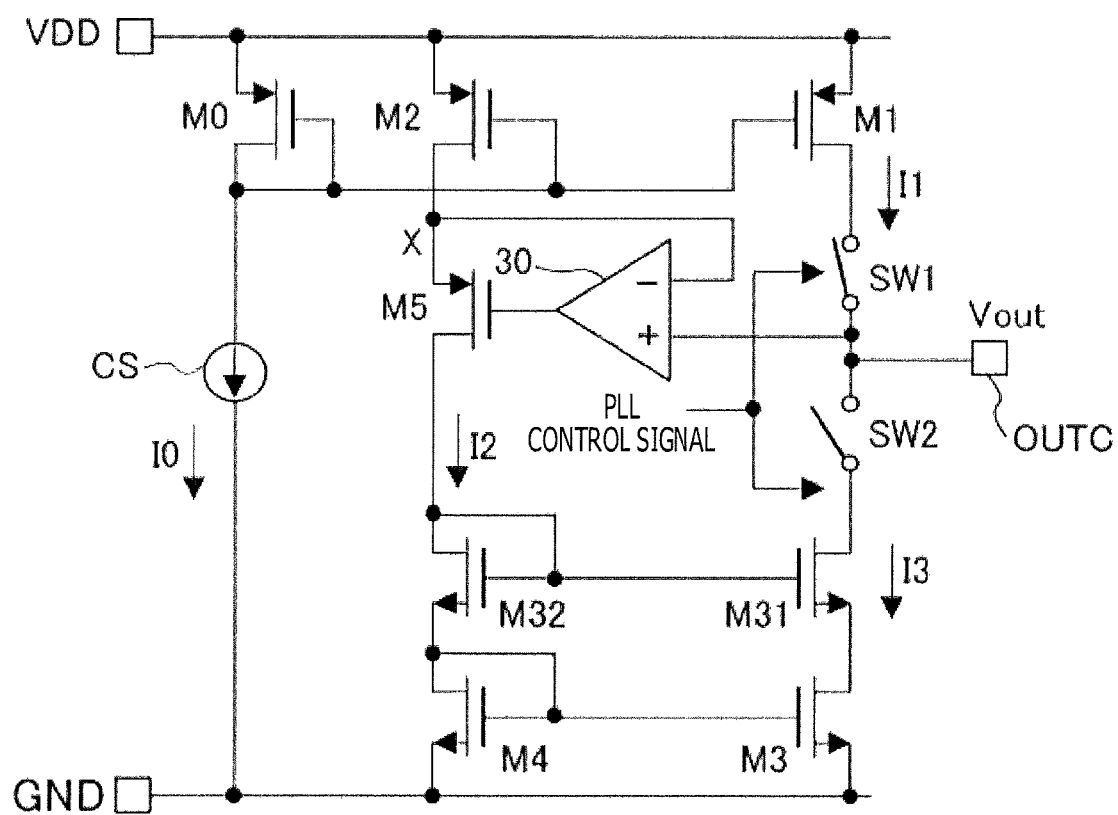
FIG. 17 illustrates an example of a charge pump circuit.

FIG. 17 illustrates an example of a charge pump circuit. The charge pump circuit illustrated in FIG. 17 may have a cascode configuration in which transistors M31 and M32 having the same polarity (n-type) are respectively coupled, in series, to the M3 and the M4 of the charge pump circuit illustrated in FIG. 10. Due to the cascode structure, the operation range of the Vout is narrowed as compared with FIG. 10, but an effect of current stabilization is obtained. In FIG. 17, the M3 and M4 sides correspond to the cascode structure, but the M1 and M2 sides may correspond to the cascode structure. In FIG. 16, the cascode structure may be applied.

Figure 18A:
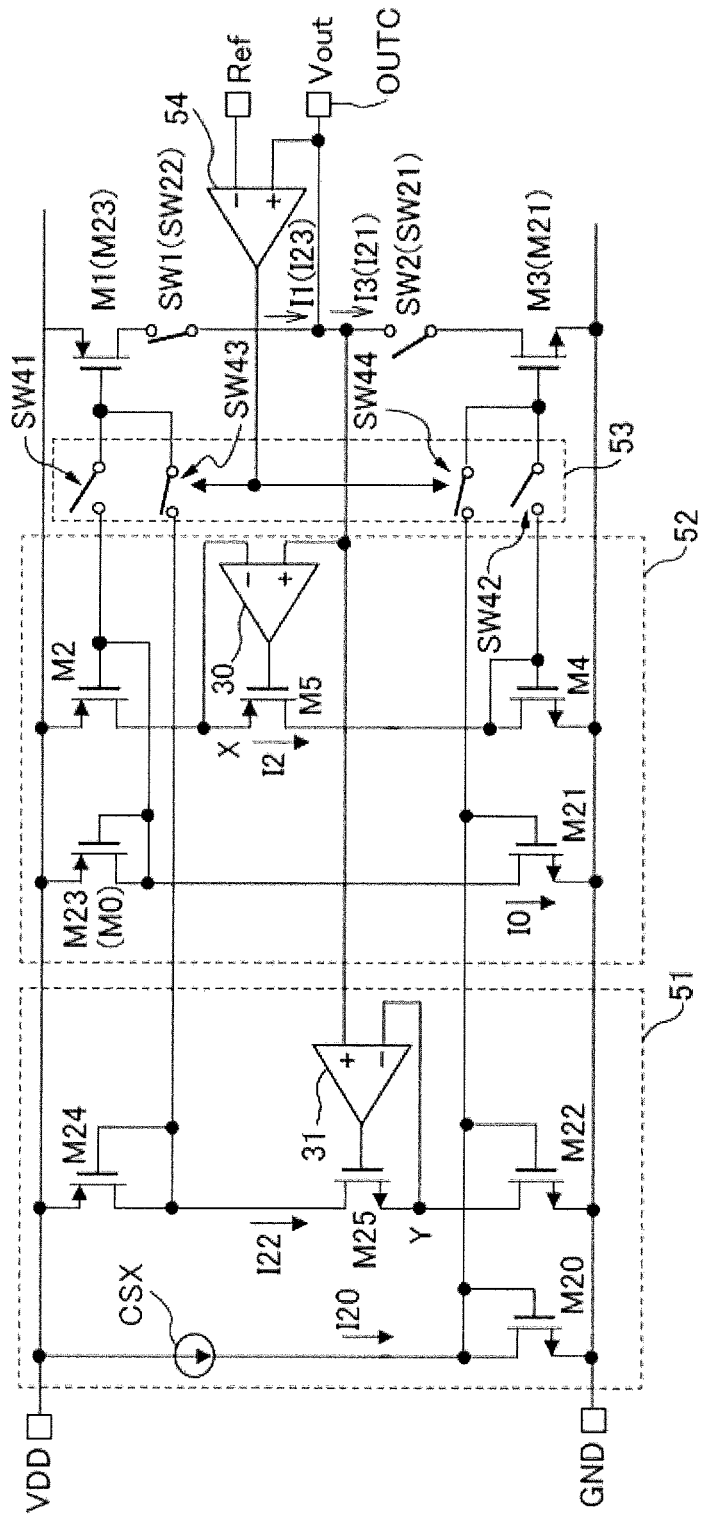
FIG. 18A illustrates an example of a charge pump circuit.
Figure 18B:
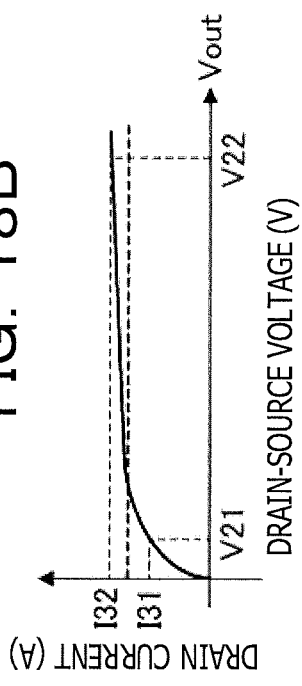
FIG. 18B illustrates an example of output (drain) current characteristics for drain-source voltage.

FIG. 18A illustrates an example of a charge pump circuit. FIG. 18B illustrates an example of an output (drain) current characteristic for drain-source voltage. The characteristic illustrated in FIG. 18B may be a characteristic of a transistor that is used for the charge pump circuit illustrated in FIG. 18A.

The charge pump circuit illustrated in FIG. 18A may have a circuit configuration in which the charge pump circuit using the current mirror circuit of the p-type FET illustrated in FIG. 10, and the charge pump circuit using the current mirror circuit of the n-type FET illustrated in FIG. 16 are combined with each other. The range indicated by the reference number 51 is a range other than the output unit of the current mirror circuit including the n-type FET illustrated in FIG. 16 (portion including a M21 and a M23). The range indicated by the reference number 52 is a range other than the output unit of the charge pump circuit using the current mirror circuit including the p-type FET illustrated in FIG. 10 (portion including the M1 and the M3). The reference number 53 corresponds to a circuit portion that includes four switches SW41 to SW44, and in which a signal that is applied to the gate of the transistor of the output unit is switched. The output unit is a portion that corresponds to the M1, the M3, the SW1 and the SW2 of the charge pump circuit illustrated in FIG. 10, and also corresponds to the M21, the M23, a SW21 and a SW22 of the charge pump circuit of FIG. 16. In the reference number 54, the Vout is compared with reference voltage Vref, and a signal that is used to switch between the SW41 to SW44 is output.

When the current mirror circuit of the p-type FET and the current mirror circuit of the n-type FET are combined with each other, it may be difficult to perform the simultaneous operation of the two current mirror circuits. Therefore, in FIG. 18A, when the Vout is greatly changed so as to be increased or decreased, the SW41 to SW44 are switched. For example, as illustrated in FIG. 18B, drain current I31 is obtained when the drain-source voltage of the transistor is at V21, and drain current I32 is obtained when the drain-source voltage of the transistor is at V22. The charge current may be within the range of the I31 and the I32. For example, feedback is performed so that the voltage of the drain (point X or Y) of the transistor (M2 or M22) that is included in the current mirror circuit becomes substantially the same as the Vout, so that the drain current of the transistor may be within the range of the I31 and the I32. In a case in which the intermediate potential between the V21 and the V22 is Ref, when the drain-source voltage becomes the Ref, the current mirror circuit to be used is switched. For example, when the Vout is higher than the Ref, the connections of the SW41 and the SW42 are interrupted and the connections of the SW43 and the SW44 are established so that the current mirror circuit 51 of an n-type FET is caused to be operated. When the Vout is lower than the Ref, the connections of the SW41 and the SW42 are established and the connections of the SW43 and the SW44 are interrupted so that a current mirror circuit 52 of a p-type FET is caused to be operated.

When the connections of the SW41 and the SW42 are interrupted and the connections of the SW43 and the SW44 are established, the current mirror circuit 51 and the M1 (M23) of the output unit form a current mirror circuit with the M24, and the current mirror circuit 51 and the M3 (M21) form a current mirror circuit with the M22, so that the circuit illustrated in FIG. 18A is equal to the circuit of FIG. 16. When the connections of the SW41 and the SW42 are established and the connections of the SW43 and the SW44 are interrupted, the current mirror circuit 52 and the M1 (M23) of the output unit form a current mirror circuit with the M24, and the current mirror circuit 52 and the M3 (M21) form a current mirror circuit with the M22, so that the circuit illustrated in FIG. 18A is equal to the circuit of FIG. 10. At that time, the M21 forms a current mirror circuit with the M20, and operates as a constant current source because the constant current flows, and the M23 operates as the M0.

Figure 19A:
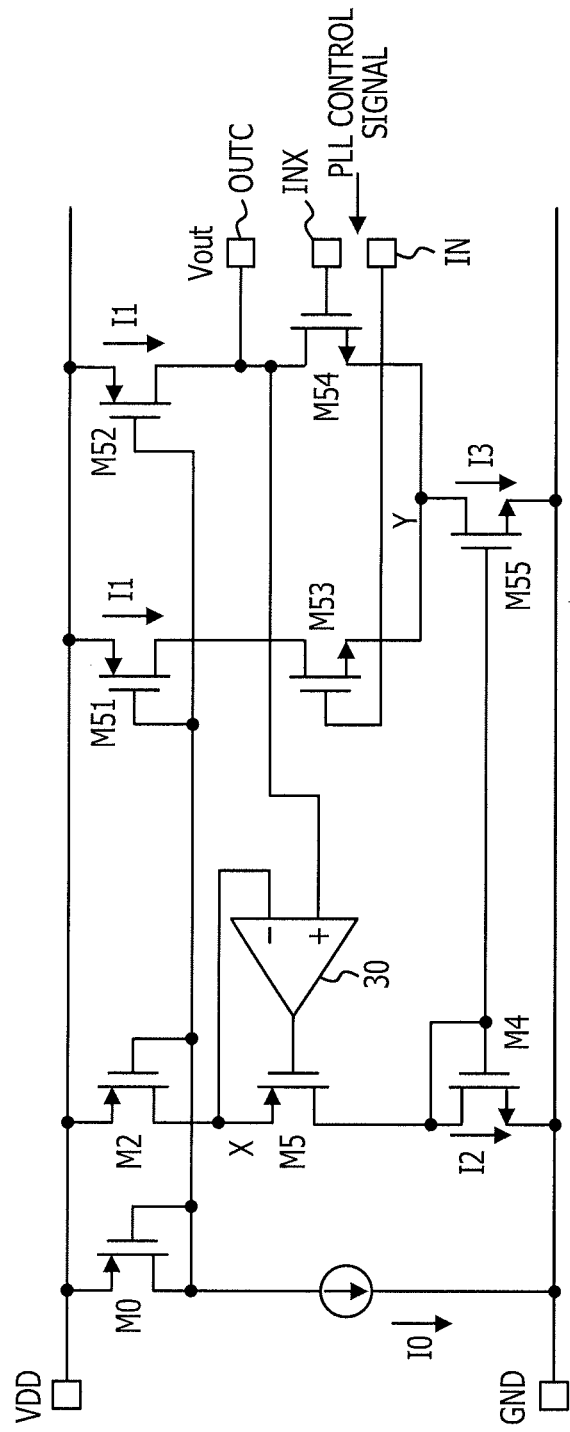
FIG. 19A and FIG. 19B illustrate an example of a charge pump circuit.
Figure 19B:
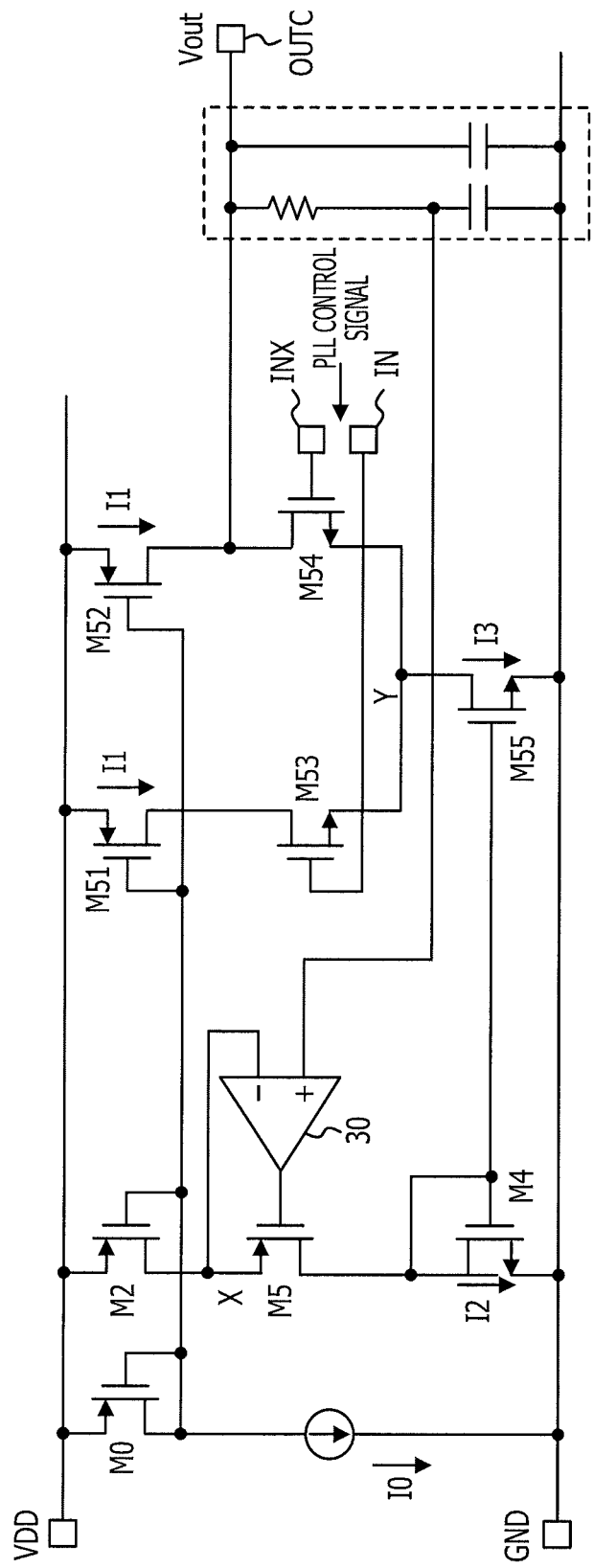

FIG. 19A and FIG. 19B illustrate an example of a charge pump circuit. The charge pump circuit illustrated in FIG. 19A and FIG. 19B may have a configuration in which the output unit that is constituted by the M1, the M3, the SW1 and the SW2 as illustrated in FIG. 10A and FIG. 10B is replaced with a differential pair. In the charge pump circuit in FIG. 19B, a loop filter which is surrounded by a dotted line is added at an output part. The differential pair includes p-type transistors M51 and M52 that are coupled to the VDD, n-type transistors M53 and M54 that are respectively coupled to the M51 and the M52 in series, and a n-type transistor M55 that is coupled between the source of the M53 and the M54, and the GND. The gates of the M51 and the M52 are coupled to the drain of the M0 so that the M51 and the M52 form a current mirror circuit with the M0. The gate of the M55 is connected to the drain of the M4 and the M55 forms a current mirror circuit with the M4. The channel width of the M55 may be set at a value twice that of the M4. The gates of the M53 and the M54 are respectively coupled to input terminals IN and INX to which a PLL control signal is input. A connection node between the M52 and the M54 is coupled to the output terminal OUTC, and charge current is input and output to and from the connection node.

The M2, the M51 and the M52 form a current mirror circuit with the M0, and current that flows through the M2 may be substantially the same as current I1 that flows through the M51 and the M52. The M4 and the M55 forms a current mirror circuit, and the channel width of the M55 is twice that of the M4, so that current I3 that flows through the M55 is twice current that flows through the M4, for example, the I2. Therefore, "2I1=I3" is satisfied.

As illustrated in FIG. 2B, the current that flows through the M52 is changed depending on the Vout. In FIG. 19, by the feedback system of the M5 and the comparison circuit 30, a difference between the potential at the point X and the Vout is controlled so as to become zero, so that the I1 may not be affected by the Vout. This OUTC, which is coupled to the loop filter, is one example of the output of charge pump, and the input of the comparison circuit 30 may be acquired not only from the OUTC, but also from any port of the loop filter as illustrated in FIG. 19B. The input of the comparison circuit 30 may be coupled to any port of the loop filter, and this structure is suitable to suppress the effect of the parasitic capacitor of the input port of the comparison circuit 30 to the output port OUTC caused.

Figure 20A:
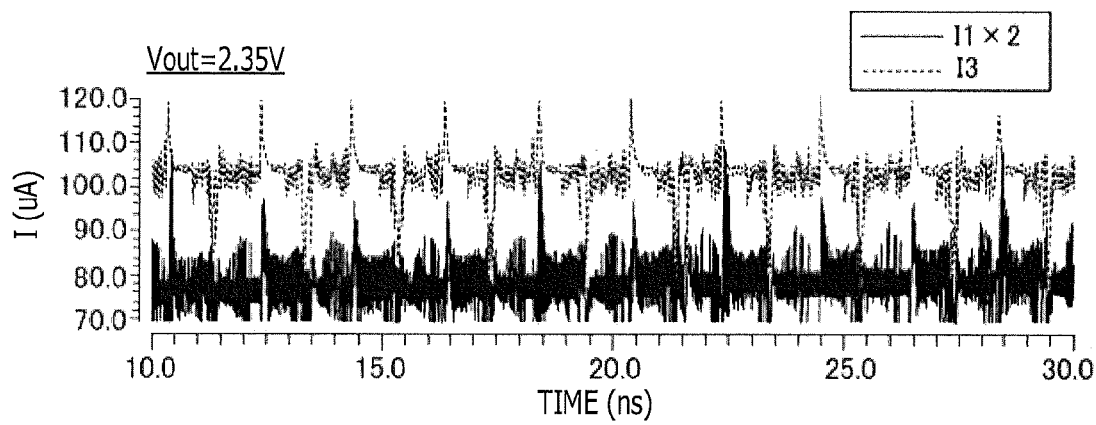
FIGS. 20A, 20B and 20C illustrate an example of a current.
Figure 20B:
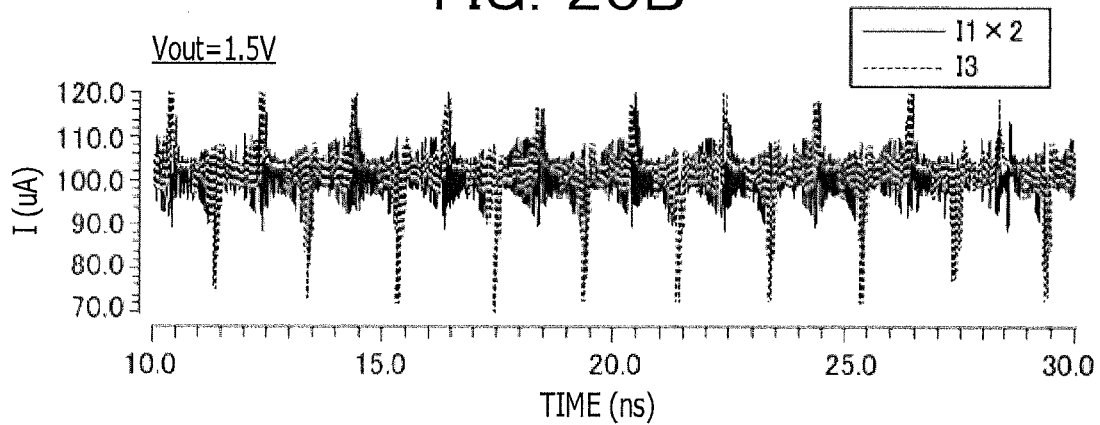
Figure 20C:
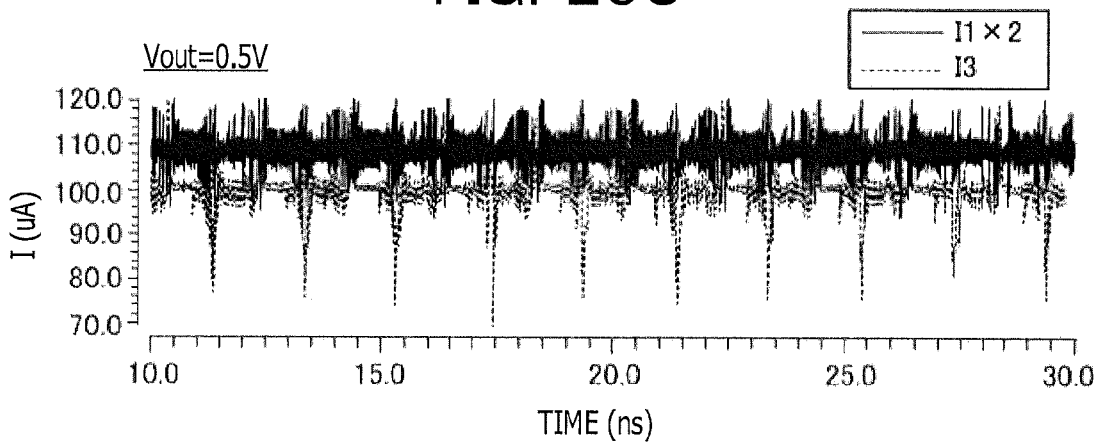

FIGS. 20A to 20C illustrate an example current. Each of FIGS. 20A to 20C illustrates current I1×2 that flows through the M52 and current I3 that flows through M55 when the feedback system of the M5 and the comparison circuit 30 are not provided in a case in which Vout is different in the charge pump circuit illustrated in FIG. 19. FIG. 20A illustrates current when "Vout=2.35V" is satisfied. FIG. 20B illustrates current when "Vout=1.5V" is satisfied. FIG. 20C illustrates current when "Vout=0.5V" is satisfied. When "Vout=1.5V" is satisfied, the I1×2 and the I3 are at a similar level, but when "Vout=2.35V" and "Vout=0.5V" is satisfied, there is a large difference between the I1×2 and the I3.

Figure 21A:
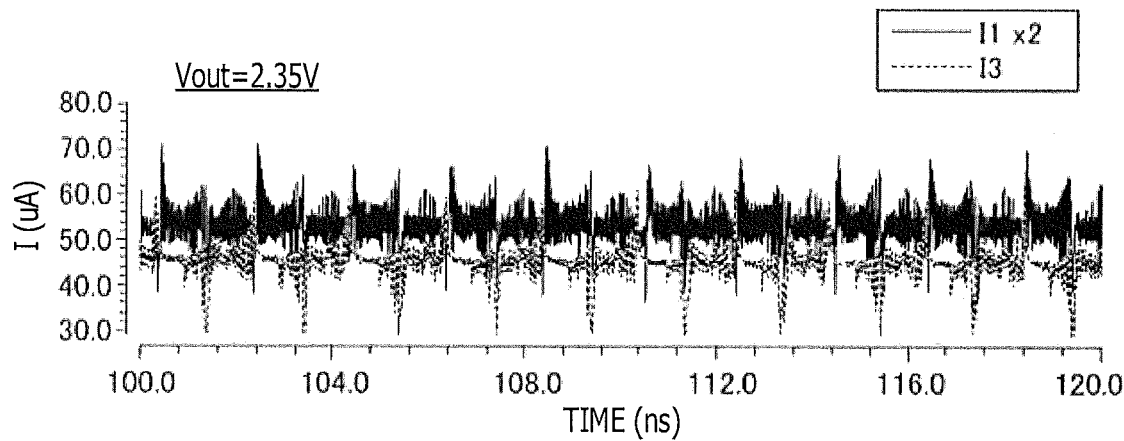
FIGS. 21A, 21B and 21C illustrate an example of a current.
Figure 21B:
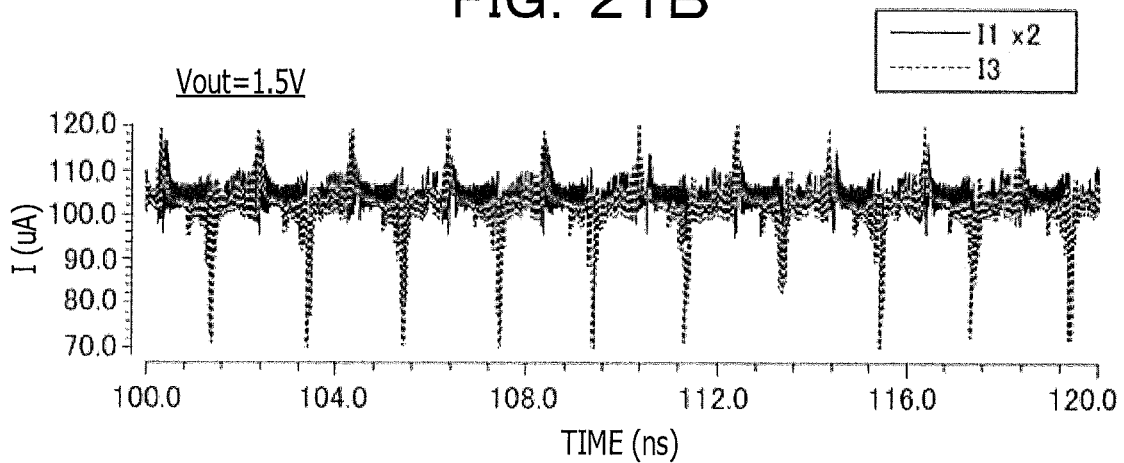
Figure 21C:
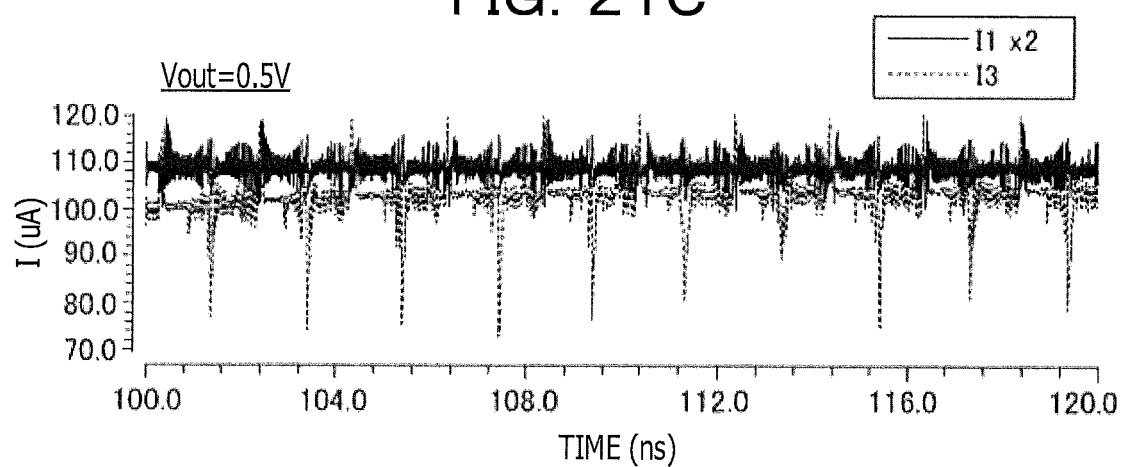

FIGS. 21A to 21C illustrate an example of current. Each of FIGS. 21A to 21C illustrates current I1×2 that flows through the M52 and current I3 that flows through the M55 in a case in which Vout is different in the charge pump circuit illustrated in FIG. 19. FIG. 21A illustrates current when "Vout=2.35V" is satisfied. FIG. 21B illustrates current when "Vout=1.5V" is satisfied. FIG. 21C illustrates current when "Vout=0.5V" is satisfied. When "Vout=1.5V" is satisfied, the I1×2 and the I3 are at a similar level, but when "Vout=2.35V" and "Vout=0.5VS" is satisfied, there is a difference between the I1×2 and the I3, but the difference is reduced as compared with FIGS. 20A and 20C.

For example, the current ratios of the current mirror may not be equal, and may be set as appropriate. The transistor is not limited to an FET.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A current mirror circuit comprising:
   a reference current circuit including a reference transistor and a constant current source that are coupled in series between a high potential source and a low potential source, the reference transistor and the constant current source being coupled with each other at a node;
   a first proportional current circuit, including a first transistor that is coupled to one of the high potential source and the low potential source at a source terminal of the first transistor and is coupled to the node at a gate of the first transistor so as to form a first current mirror circuit with the reference transistor, configured to generate a first current having a first ratio to a reference current of the reference current circuit;
   a first output terminal, coupled to drain terminal of the first transistor, configured to output the first current;
   a second proportional current circuit, including a second transistor that is coupled to one of the high potential source and the low potential source at a source terminal of the second transistor and is coupled to the node at a gate of the second transistor so as to form a second current mirror circuit with the reference transistor, configured to generate a second current having a second ratio to the reference current;
   a comparison circuit, coupled to the drain terminal of the first transistor and a drain terminal of the second transistor, configured to output a difference between a drain voltage of the first transistor and a drain voltage of the second transistor; and
   a current adjustment transistor coupled to a drain of the second transistor and including a gate to which an output of the comparison circuit is applied.

2. The current mirror circuit according to claim 1, wherein a polarity of the second transistor is identical to a polarity of the current adjustment transistor.

3. The current mirror circuit according to claim 1, wherein the first current is output to the first output terminal from a drain of the first transistor, and
   the second current is output to a reference terminal from a drain of the current adjustment transistor.

4. The current mirror circuit according to claim 1, wherein an input of the comparison circuit is coupled to a loop filter which is coupled to one of a drain of the first transistor and the drain of the second transistor.

5. The current mirror circuit according to claim 1, further comprising:
   a second output terminal configured to output the second current,
   wherein one terminal of the current adjustment transistor is coupled to the drain of the second transistor and the other terminal of the current adjustment transistor is coupled to the second output terminal.

6. The current mirror circuit according to claim 1, wherein the other terminal of the first transistor is coupled to the first output terminal directly.

7. The current mirror circuit according to claim 1, wherein a gate of the reference transistor is coupled to the node.

* * * * *